US012800912B2

(12) United States Patent
Ishii et al.

(10) Patent No.: US 12,800,912 B2
(45) Date of Patent: Nov. 17, 2026

(54) OPTICAL MODULE AND OPTICAL DEVICE

(71) Applicant: Murata Manufacturing Co., Ltd., Nagaokakyo (JP)

(72) Inventors: Yuuki Ishii, Nagaokakyo (JP); Yuka Tanaka, Nagaokakyo (JP); Katsuhiro Tabuchi, Nagaokakyo (JP); Noritaka Kishi, Nagaokakyo (JP); Hitoshi Sakaguchi, Nagaokakyo (JP); Takahide Nakadoi, Nagaokakyo (JP); Nobumasa Kitamori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 311 days.

(21) Appl. No.: 18/652,021

(22) Filed: May 1, 2024

(65) Prior Publication Data

US 2024/0280804 A1 Aug. 22, 2024

Related U.S. Application Data

(63) Continuation of application No. PCT/JP2022/023842, filed on Jun. 14, 2022.

(30) Foreign Application Priority Data

Nov. 30, 2021 (JP) ................................ 2021-194442

(51) Int. Cl.
*G02B 27/00* (2006.01)
*H10N 30/20* (2023.01)

(52) U.S. Cl.
CPC ..... *G02B 27/0006* (2013.01); *H10N 30/2047* (2023.02)

(58) Field of Classification Search
CPC .. G02B 27/00; G02B 27/0006; G02B 27/646; G02B 7/02; G02B 7/00; G02B 7/008;
(Continued)

(56) References Cited

U.S. PATENT DOCUMENTS

| | | | |
|---|---|---|---|
| 2020/0039475 A1 | 2/2020 | Ichiguchi et al. | |
| 2020/0358938 A1 | 11/2020 | Hsu et al. | |

(Continued)

FOREIGN PATENT DOCUMENTS

| | | | |
|---|---|---|---|
| JP | 2017170303 A | 9/2017 | |
| WO | 2018198464 A1 | 11/2018 | |

(Continued)

OTHER PUBLICATIONS

International Search Report in PCT/JP2022/023842, mailed Aug. 23, 2022, 3 pages.

(Continued)

*Primary Examiner* — Jie Lei
(74) *Attorney, Agent, or Firm* — Keating & Bennett, LLP

(57) ABSTRACT

An optical module includes a translucent body, a tubular vibrator supporting the translucent body, a piezoelectric element located at the vibrator to vibrate the vibrator, and an inner-layer optical component at an inner side portion of the vibrator, in which a first gap is located between the translucent body and the inner-layer optical component, a second gap is located between the piezoelectric element and the inner-layer optical component, at least one of a first dimension of the first gap in a vibration direction of the translucent body and a second dimension of the second gap in the vibration direction of the vibrator is in a range of about [(n×λ/2)+0.1 mm] or more and about [{(n+1)×λ/2}−0.1 mm] or less, and n indicates an integer of 0 or more, and λ indicates a wavelength of an acoustic wave generated by vibration.

20 Claims, 13 Drawing Sheets

100

(58) Field of Classification Search
CPC ........ G02B 7/026; G02B 7/028; G03B 15/00; G03B 17/02; G03B 17/08; G03B 17/56; G03B 30/00; B60S 1/02; B60S 1/06; B60S 1/46; B60S 1/56; H10N 30/20; H10N 30/2047
USPC ........... 359/896, 507–509, 512, 198.1, 199.1
See application file for complete search history.

(56) References Cited

U.S. PATENT DOCUMENTS

| | | | |
|---|---|---|---|
| 2020/0379320 | A1 | 12/2020 | Fujimoto et al. |
| 2021/0154701 | A1 | 5/2021 | Fujimoto et al. |
| 2021/0359193 | A1 | 11/2021 | Kishi et al. |

FOREIGN PATENT DOCUMENTS

| | | | |
|---|---|---|---|
| WO | 2020003573 | A1 | 1/2020 |
| WO | 2021100228 | A1 | 5/2021 |
| WO | 2021229852 | A1 | 11/2021 |

OTHER PUBLICATIONS

Written Opinion in PCT/JP2022/023842, mailed Aug. 23, 2022, 4 pages.

| INNER-LAYER OPTICAL MEMBER | ACOUSTIC VELOCITY (m/s) | DENSITY (kg/m$^3$) | ACOUSTIC IMPEDANCE (Ns/m$^3$) |
|---|---|---|---|
| RESIN | 1780 | 20 | 35600 |
| GLASS | 4000 | 2300 | 9200000 |
| AIR (REFERENCE VALUE) | 340 | 1.2 | 410 |

OPTICAL MODULE AND OPTICAL DEVICE

CROSS REFERENCE TO RELATED APPLICATIONS

This application claims the benefit of priority to Japanese Patent Application No. 2021-194442 filed on Nov. 30, 2021 and is a Continuation application of PCT Application No. PCT/JP2022/023842 filed on Jun. 14, 2022. The entire contents of each application are hereby incorporated herein by reference.

BACKGROUND OF THE INVENTION

1. Field of the Invention

The present invention relates to optical modules and optical devices to remove a liquid droplet or the like by vibration.

2. Description of the Related Art

Japanese Unexamined Patent Application Publication No. 2017-170303 discloses a liquid droplet exclusion device including a vibration generation member that is connected to an end portion of a curved surface that forms a dome portion of an optical element, the vibration generation member generating a bending vibration in the dome portion. In the liquid droplet exclusion device disclosed in Japanese Unexamined Patent Application Publication No. 2017-170303, a drip-resistant cover and a piezoelectric element are adhesively fixed to each other, and the drip-resistant cover is caused to bend and vibrate by the vibration of the piezoelectric element, thereby removing liquid droplets and the like adhering to the surface of the drip-resistant cover.

SUMMARY OF THE INVENTION

In the device disclosed in Japanese Unexamined Patent Application Publication No. 2017-170303, there is still room for improvement in terms of reducing or preventing the vibration attenuation.

According to an example embodiment of the present invention, an optical module includes a translucent body, a vibrator that is tubular and supports the translucent body, a piezoelectric element located at the vibrator to vibrate the vibrator, and an inner-layer optical component located at an inner side portion of the vibrator, wherein a first gap is located between the translucent body and the inner-layer optical component, a second gap is located between the piezoelectric element and the inner-layer optical component, at least one of a first dimension of the first gap in a vibration direction of the translucent body and a second dimension of the second gap in a vibration direction of the vibrator is in a range of about $[(n\times\lambda/2)+0.1\text{ mm}]$ or more and about $[\{(n+1)\times\lambda/2\}-0.1\text{ mm}]$ or less, and n indicates an integer of 0 or more, and $\lambda$ indicates a wavelength of an acoustic wave generated by vibration.

According to another example embodiment of the present invention, an optical device includes the optical module according to the above example embodiment, and an optical element at the optical module.

Example embodiments of the present invention provide optical modules and optical devices each capable of reducing or preventing vibration attenuation.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
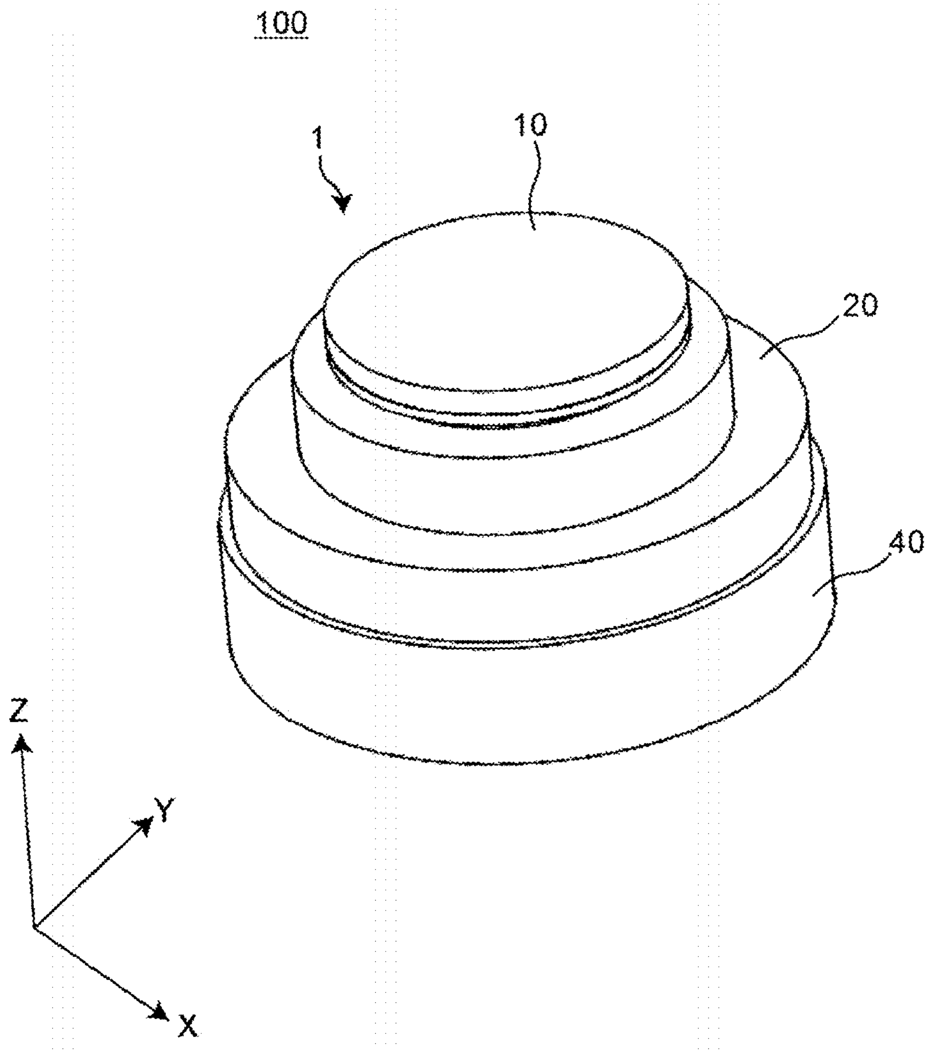
FIG. 1 is a schematic perspective view showing an example of an optical device in Example Embodiment 1 according to the present invention.

In a vehicle provided with an imaging unit including an imaging element or the like in a front portion or a rear portion of the vehicle, an image acquired by the imaging unit is used to control a safety device or perform automatic driving control. Such an imaging unit is disposed outside the vehicle in some cases. In this case, a translucent body such as a protective cover or a lens is disposed at an exterior of the imaging unit.

Therefore, foreign matters such as raindrops (liquid droplets), mud, and dust may adhere to the translucent body. In a case where a foreign matter adheres to the translucent body, in some cases, the foreign matter is reflected in an image acquired by the imaging unit, and it is not possible to obtain a clear image.

In recent years, a device that removes a foreign matter adhering to a translucent body by vibrating the translucent body has been developed. In such a device, the translucent body is disposed at a tubular vibrator, and the translucent body is vibrated by vibrating the vibrator with a piezoelectric element or the like. In addition, an inner-layer optical component is disposed inside the vibrator.

However, in some cases, the vibration of the translucent body and/or the vibrator is attenuated depending on the position of the inner-layer optical component disposed inside the vibrator. For example, a gap is located between the translucent body and the inner-layer optical component, and the vibration attenuation occurs depending on the dimension of the gap. As a result, there is a problem that it is not possible to sufficiently remove the foreign matter adhering to the translucent body. This is a new problem discovered by the inventors of example embodiments of the present invention.

For example, in a case where the translucent body is vibrated, an acoustic wave is generated by the vibration. The acoustic wave generated from the translucent body is reflected by the inner-layer optical component, and a standing wave including an antinode and a node of the acoustic wave is generated. In the antinode of the acoustic wave, the acoustic pressure is increased as compared with other portions, and the air is further compressed. Therefore, in the antinode of the acoustic wave, the compressed air acts as a damper, and the vibration attenuation occurs. Thus, in a case where the antinode of the acoustic wave is formed at a position at which the translucent body is disposed in the gap between the translucent body and the inner-layer optical component, the vibration of the translucent body is attenuated. The same phenomenon occurs for a gap between the vibrator and the inner-layer optical component. As a result, in some cases, it is not possible to sufficiently remove the foreign matter adhering to the translucent body.

The present inventors have conducted intensive studies, discovered and conceived of a configuration in which the attenuation of the vibration is reduced or prevented by avoiding the antinode of an acoustic wave generated by vibration, and led to development of example embodiments of the present invention.

According to an example embodiment of the present invention, an optical module includes a translucent body, a vibrator that is tubular and supports the translucent body, a piezoelectric element located at the vibrator to vibrate the vibrator, and an inner-layer optical component located at an inner side portion of the vibrator. A first gap is located between the translucent body and the inner-layer optical component, a second gap is located between the piezoelectric element and the inner-layer optical component, at least one of a first dimension of the first gap in a vibration direction of the translucent body and a second dimension of the second gap in a vibration direction of the vibrator is in a range of about $[(n\times\lambda/2)+0.1\ \text{mm}]$ or more and about $[\{(n+1)\times\lambda/2\}-0.1\ \text{mm}]$ or less, and n indicates an integer of 0 or more, and $\lambda$ indicates a wavelength of an acoustic wave generated by vibration.

With such a configuration, it is possible to reduce or prevent the vibration attenuation.

At least one of the first dimension and the second dimension may be in a range of about 0.1 mm or more and about $(\lambda/2-0.1\ \text{mm})$ or less.

With such a configuration, it is possible to further reduce or prevent the vibration attenuation.

A third gap may be provided between the vibrator and a side wall of the inner-layer optical component, and a third dimension of the third gap may be about 0.1 mm or more.

With such a configuration, it is possible to further reduce or prevent the vibration attenuation.

The first dimension of the first gap may be a distance between a central portion of the translucent body and the inner-layer optical component.

With such a configuration, it is possible to reduce or prevent the vibration attenuation in the central portion of the translucent body.

The vibrator and the piezoelectric element may be configured such that an entirety of the translucent body vibrates uniformly or substantially uniformly.

With such a configuration, it is possible to further reduce or prevent the vibration attenuation.

The vibrator and the piezoelectric element may be configured such that the central portion of the translucent body vibrates more largely than an end portion.

With such a configuration, it is possible to further reduce or prevent the vibration attenuation.

The inner-layer optical component may be made of a material having an acoustic impedance smaller than an acoustic impedance of the translucent body.

With such a configuration, it is possible to reduce or prevent the reflection of an acoustic wave in the inner-layer optical component and further reduce or prevent the vibration attenuation.

The inner-layer optical component may be made of a resin.

With such a configuration, it is possible to further reduce or prevent the reflection of the acoustic wave in the inner-layer optical component and further reduce or prevent the vibration attenuation.

The inner-layer optical component may include an inner-layer lens, a lens holder that holds the inner-layer lens, and an inner-layer flange that extends from an outer wall of the lens holder toward an outer side portion. The first gap may be provided between the translucent body and the inner-layer lens, and the second gap may be provided between the piezoelectric element and the inner-layer flange.

With such a configuration, it is possible to further reduce or prevent the vibration attenuation.

The inner-layer optical component may include a first surface that defines the first gap and a second surface that defines the second gap, and an acoustic wave suppressor to suppress reflection of an acoustic wave may be provided at at least one of the first surface and the second surface.

With such a configuration, it is possible to reduce or prevent the reflection of the acoustic wave by an acoustic wave suppressor and to reduce or prevent the vibration attenuation.

The inner-layer optical component may include a first surface that defines the first gap and a second surface that defines the second gap, and at least one of the first surface and the second surface may be resin coated.

With such a configuration, it is possible to reduce or prevent the reflection of the acoustic wave by the resin coating and to reduce or prevent the vibration attenuation.

An inner space of the vibrator may be in a vacuum or at negative pressure.

With such a configuration, it is possible to further reduce or prevent the vibration attenuation.

The inner space of the vibrator may include a gas having density a lower than density of air.

With such a configuration, it is possible to further reduce or prevent the vibration attenuation.

In a case where a position of the translucent body in a state in which the translucent body does not vibrate is a reference position, a direction in which the translucent body is spaced away from the inner-layer optical component with respect to the reference position in a thickness direction (Z-direction) of the translucent body is a positive direction, and a direction in which the translucent body approaches the inner-layer optical component with respect to the reference position is a negative direction, in the translucent body, displacement in the positive direction may be larger than displacement in the negative direction.

With such a configuration, it is possible to further reduce or prevent the vibration attenuation.

The optical module may further include a controller configured or programmed to control the piezoelectric element and repeat application of a positive-direction voltage and stopping of voltage application with respect to the piezoelectric element.

With such a configuration, it is possible to further reduce or prevent the vibration attenuation.

According to another example embodiment of the present invention, an optical device includes the optical module according to the above example embodiment, and an optical element at the optical module.

With such a configuration, it is possible to reduce or prevent the vibration attenuation.

Hereinafter, example embodiments of the present invention will be described with reference to the accompanying drawings. The following descriptions of example embodiments are merely examples in essence, and is not intended to limit the present disclosure or applications of example embodiments of the present disclosure. Further, the drawings are schematic, and the proportions of the respective dimensions and the like do not necessarily match the actual proportions.

Example Embodiment 1

Optical Device

Figure 2:
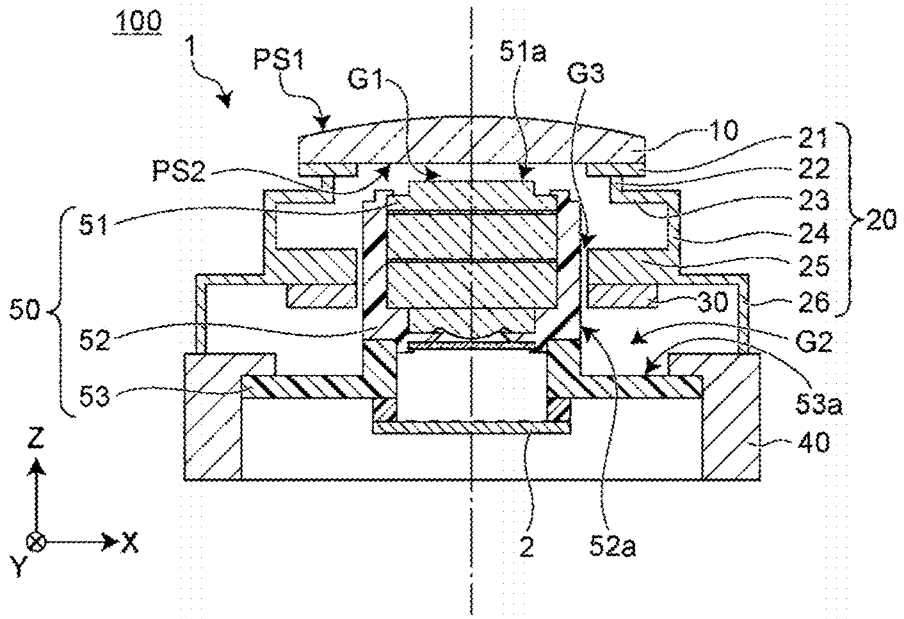
FIG. 2 is a schematic cross-sectional view showing an example of a configuration of the optical device in Example Embodiment 1 according to the present invention.

FIG. 1 is a schematic perspective view showing an example of an optical device 100 in Example Embodiment 1 according to the present invention. FIG. 2 is a schematic cross-sectional view showing an example of a configuration of the optical device 100 in Example Embodiment 1 according to the present invention. The X, Y, and Z-directions in the drawings indicate a longitudinal direction, a lateral direction, and a height direction of the optical device 100.

As shown in FIGS. 1 and 2, the optical device 100 includes an optical module 1 and an optical element 2. The optical element 2 is disposed at the optical module 1. Specifically, the optical element 2 is disposed inside the optical module 1.

In the present example embodiment, an example in which the optical device 100 is an imaging device will be described. The optical device 100 is attached to, for example, a front or rear of a vehicle and images an imaging target. The place where the optical device 100 is attached is not limited to the vehicle, and the optical device 100 may be attached to another device such as a ship or an aircraft.

The optical element 2 is an imaging element, and is, for example, a CMOS, a CCD, a bolometer, or a thermopile that receives light having a wavelength in any of the visible region or the far infrared region.

In a case where the optical device 100 is attached to a vehicle or the like and is used outdoors, foreign matters such as raindrops, mud, and dust may adhere to a translucent body 10 of the optical module 1 that is disposed in a viewing field direction of the optical element 2 and covers the outside. The optical module 1 can generate vibration in order to remove foreign matters such as raindrops adhering to the translucent body 10.

Optical Module

As shown in FIGS. 1 and 2, the optical module 1 includes a translucent body 10, a vibrator 20, a piezoelectric element 30, a fixing portion 40, and an inner-layer optical component 50. The fixing portion 40 is not an essential configuration in the optical module 1.

Translucent Body

The translucent body 10 has translucency in which energy rays or light having a wavelength to be detected by the optical element 2 is transmitted through the translucent body 10. In the present example embodiment, the translucent body 10 is a cover to protect the optical element 2 and the inner-layer optical component 50 from adhering of foreign matters. In the optical device 100, the optical element 2 detects the energy ray or the light through the translucent body 10.

As a material for forming the translucent body 10, for example, translucent plastic, glass such as quartz and borosilicate, translucent ceramics, synthetic resin, or the like can be used. The strength of the translucent body 10 can be increased, for example, by forming the translucent body 10 with tempered glass. In the present example embodiment, the translucent body 10 is formed of BK-7 (borosilicate glass).

The translucent body 10 has, for example, a dome shape. The translucent body 10 is formed in a circular shape when viewed in the height direction (Z-direction) of the optical module 1, and the thickness of the translucent body 10 continuously decreases from the center of the translucent body 10 toward the outer periphery. The shape of the translucent body 10 is not limited thereto.

In the present example embodiment, the translucent body 10 includes a first main surface PS1 and a second main surface PS2 on an opposite side of the first main surface PS1. The first main surface PS1 is a main surface located at the outer side portion of the translucent body 10. The first main surface PS1 is a continuous curved surface. Specifically, the first main surface PS1 is curved roundly. The second main surface PS2 is a main surface located at the inner side portion of the translucent body 10. The second main surface PS2 is flat.

An outer peripheral end portion of the translucent body 10 is bonded to the vibrator 20. Specifically, the second main surface PS2 of the translucent body 10 and a vibration flange 21 of the vibrator 20 are bonded to each other along the outer periphery of the translucent body 10. The translucent body 10 and the vibrator 20 can be bonded to each other using, for example, an adhesive or a brazing material. Alternatively, thermal pressure bonding, anodic bonding, or the like can be used.

Vibrator

The vibrator 20 is tubular and supports the translucent body 10. The vibrator 20 vibrates the translucent body 10 by being vibrated by the piezoelectric element 30.

The vibrator 20 includes the vibration flange 21, a first tubular member 22, a spring portion 23, a second tubular member 24, a vibration plate 25, and a connection portion 26. The connection portion 26 is not an essential configuration in the vibrator 20.

The vibration flange 21 includes an annular plate when viewed in the height direction (Z-direction) of the optical module 1. The vibration flange 21 is disposed along the outer periphery of the translucent body 10 and is bonded to the translucent body 10. The vibration flange 21 stably supports the translucent body 10 by being in surface contact with the translucent body 10.

The first tubular member 22 has a tubular shape having one end and the other end. The first tubular member 22 is formed by a hollow member in which a through-hole is provided. The through-hole is provided in the height direction (Z-direction) of the optical module 1, and openings of the through-hole are provided at the one end and the other end of the first tubular member 22. The first tubular member 22 has, for example, a cylindrical shape. The outer shape of the first tubular member 22 and the opening of the through-hole are formed in a circular shape when viewed from the height direction of the optical module 1.

The vibration flange 21 is provided at the one end of the first tubular member 22, and the spring portion 23 is provided at the other end of the first tubular member 22. The first tubular member 22 is supported by the spring portion 23 while supporting the vibration flange 21.

The spring portion 23 includes a leaf spring that supports the other end of the first tubular member 22. The spring portion 23 is configured to be elastically deformed. The spring portion 23 supports the other end of the first tubular member 22 having a cylindrical shape and extends toward the outer side portion of the first tubular member 22 from a position at which the spring portion 23 supports the other end of the first tubular member 22.

The spring portion 23 is formed in a plate shape. The spring portion 23 has a hollow circular shape in which a through-hole is provided, and extends to surround the periphery of the first tubular member 22 in a circular shape. In other words, the spring portion 23 has an annular plate shape. The annular plate shape means a shape in which a plate has a ring shape. The outer shape of the spring portion 23 and an opening of the through-hole have a circular shape when viewed from the height direction (Z-direction) of the optical module 1.

The spring portion 23 connects the first tubular member 22 and the second tubular member 24. Specifically, the spring portion 23 is connected to the first tubular member 22 on an inner peripheral side of the spring portion 23 and is connected to the second tubular member 24 on an outer peripheral side of the spring portion 23.

The second tubular member 24 has a tubular shape having one end and the other end. The second tubular member 24 is located at the outer side portion of the first tubular member 22 when viewed from the height direction (Z-direction) of the optical module 1, and supports the spring portion 23. The spring portion 23 is connected to the one end of the second tubular member 24. The vibration plate 25 is connected to the other end of the second tubular member 24.

The second tubular member 24 is formed by a hollow member in which a through-hole is provided. The through-hole is provided in the height direction (Z-direction) of the optical module 1, and openings of the through-hole are provided at the one end and the other end of the second tubular member 24. The second tubular member 24 has, for example, a cylindrical shape. The outer shape of the second tubular member 24 and the opening of the through-hole are formed in a circular shape when viewed from the height direction of the optical module 1.

The vibration plate 25 is a plate-shaped structure that extends from the other end of the second tubular member 24 toward the inner side portion. The vibration plate 25 supports the other end of the second tubular member 24 and extends toward the inner side portion of the second tubular member 24 from a position at which the vibration plate 25 supports the other end of the second tubular member 24.

The vibration plate 25 has a hollow circular shape in which a through-hole is provided, and is provided along an inner periphery of the second tubular member 24. The vibration plate 25 has an annular plate shape.

The connection portion 26 connects the vibration plate 25 and the fixing portion 40 to each other. The connection portion 26 extends toward the outer side portion from the outer peripheral end portion of the vibration plate 25 and is bent toward the fixing portion 40. The connection portion 26 is supported by the fixing portion 40. The connection portion 26 is configured to have a node, and thus the vibration from the vibration plate 25 is less likely to be transmitted.

In the present example embodiment, the first tubular member 22, the spring portion 23, the second tubular member 24, the vibration plate 25, and the connection portion 26 are integrally formed. The first tubular member 22, the spring portion 23, the second tubular member 24, the vibration plate 25, and the connection portion 26 may be formed separately or may be formed by separate members.

The elements of the above-described vibrator 20 may be made of, for example, metal or ceramics. As the metal, for example, stainless steel, 42 alloy, 50 alloy, Invar, super Invar, cobalt, aluminum, duralumin, or the like can be used. Alternatively, the elements of the vibrator 20 may be made of ceramics such as alumina and zirconia, or may be made of a semiconductor such as Si. Further, the elements of the vibrator 20 may be covered with an insulating material. The elements of the vibrator 20 may be subjected to a black body treatment.

The shapes and the dispositions of the elements of the vibrator 20 are not limited to the examples described above.

Piezoelectric Element

The piezoelectric element 30 is located at the vibrator 20 to vibrate the vibrator 20. The piezoelectric element 30 is provided on the main surface of the vibration plate 25. Specifically, the piezoelectric element 30 is provided on a main surface of the vibration plate 25 on an opposite side of a side where the translucent body 10 is located. The piezoelectric element 30 vibrates the second tubular member 24 in a penetration direction (Z-direction) by vibrating the vibration plate 25. For example, the piezoelectric element 30 vibrates when a voltage is applied.

The piezoelectric element 30 has a hollow circular shape in which a through-hole is provided. In other words, the piezoelectric element 30 has an annular plate shape. The outer shape of the piezoelectric element 30 and an opening of the through-hole are formed in a circular shape when viewed from the height direction (Z-direction) of the optical module 1.

The outer shape of the piezoelectric element 30 and the opening of the through-hole are not limited thereto.

The piezoelectric element 30 includes a piezoelectric body and an electrode. As a material for forming the piezoelectric body, for example, appropriate piezoelectric ceramics such as barium titanate ($BaTiO_3$), lead zirconate titanate (PZT:$PbTiO_3 \cdot PbZrO_3$), lead titanate ($PbTiO_3$), lead metaniobate ($PbNb_2O_6$), bismuth titanate ($Bi_4Ti_3O_{12}$), and $(K,Na)NbO_3$; or appropriate piezoelectric single crystals such as $LiTaO_3$ and $LiNbO_3$ can be used. The electrode may be, for example, a Ni electrode. The electrode may be an electrode formed with a metal thin film of Ag, Au, or the like, which is formed by a sputtering method. Alternatively, the electrode can be formed by plating or vapor deposition in addition to sputtering.

The fixing portion 40 fixes the vibrator 20. The fixing portion 40 also fixes the inner-layer optical component 50. The fixing portion 40 has a tubular shape. For example, the fixing portion 40 has a cylindrical shape. The shape of the fixing portion 40 is not limited to the cylindrical shape. The fixing portion 40 may be formed integrally with the vibrator 20.

Inner-Layer Optical Component

The inner-layer optical component 50 is an optical component disposed inside the vibrator 20. For example, the inner-layer optical component 50 is a lens module.

In the present example embodiment, the inner-layer optical component 50 includes an inner-layer lens 51, a lens holder 52, and an inner-layer flange 53.

The inner-layer lens 51 includes a plurality of lenses. The inner-layer lens 51 is located on an optical path of the optical element 2 at the inner side portion of the vibrator 20 and faces the translucent body 10. The inner-layer lens 51 is held by the lens holder 52.

The lens holder 52 holds the inner-layer lens 51. The lens holder 52 has a tubular shape having one end and the other end. Specifically, the lens holder 52 includes a cylindrical shape and holds an outer periphery of the inner-layer lens 51.

The inner-layer flange 53 extends toward an outer side portion from an outer wall of the lens holder 52. Specifically, the inner-layer flange 53 is connected to the other end of the lens holder 52 and extends toward the fixing portion 40. The inner-layer flange 53 has an annular plate shape when viewed from the height direction (Z-direction) of the optical module 1. An outer periphery of the inner-layer flange 53 is connected to the fixing portion 40. The inner-layer flange 53 is fixed to the inner side portion of the vibrator 20 by being supported by the fixing portion 40.

Figure 3:
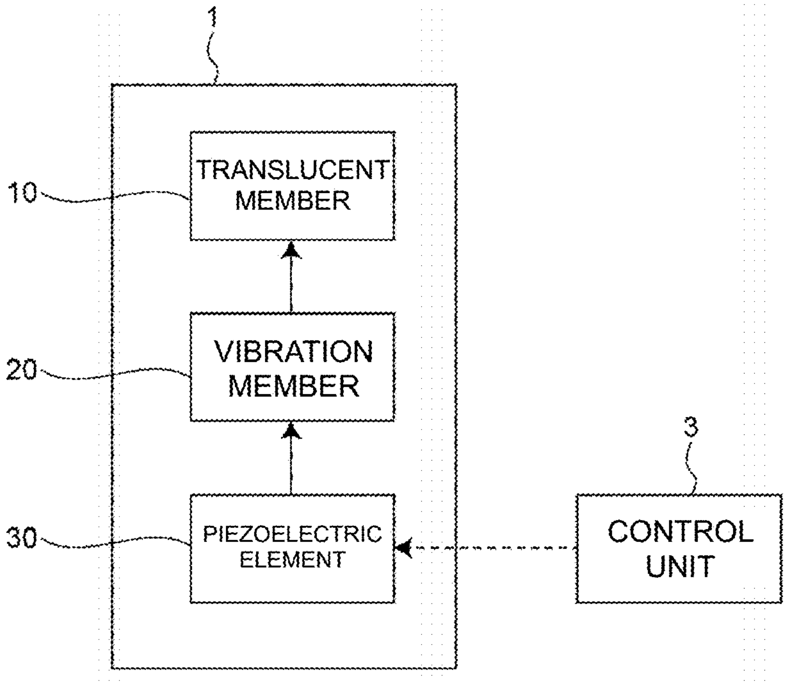
FIG. 3 is a block diagram showing an example of a functional configuration of the optical device in Example Embodiment 1 according to the present invention.

FIG. 3 is a block diagram showing an example of a functional configuration of the optical device 100 in Example Embodiment 1 according to the present invention. As shown in FIG. 3, the piezoelectric element 30 is controlled by a control unit 3 (controller). The control unit 3 is configured or programmed to apply a drive signal to generate the vibration to the piezoelectric element 30. The control unit 3 is connected to the piezoelectric element 30, for example, with a power supply conductor interposed therebetween. The piezoelectric element 30 vibrates in the height direction (Z-direction) of the optical module 1 based on the drive signal from the control unit 3. The piezoelectric element 30 is vibrated to vibrate the vibrator 20, and the vibration of the vibrator 20 is transmitted to the translucent body 10 to vibrate the translucent body 10. As a result, foreign matters such as raindrops adhering to the translucent body 10 are removed.

The control unit 3 can be realized by, for example, a semiconductor element or the like. For example, the control unit 3 can be configured by a microcomputer, a central processing unit (CPU), a micro processing unit (MPU), a graphics processing unit (GPU), a digital signal processor (DSP), a field programmable gate array (FPGA), or an application specific integrated circuit (ASIC). The function of the control unit 3 may be realized by only hardware or by a combination of hardware and software.

For example, the control unit 3 realizes a predetermined function by reading data or a program stored in a storage unit and performing various types of arithmetic processing.

The control unit 3 may be provided in the optical device 100, or may be provided in a control device different from the optical device 100. For example, in a case where the optical device 100 does not include the control unit 3, the optical device 100 may be controlled by a control device including the control unit 3. Alternatively, the optical module 1 may include the control unit 3.

Regarding a Gap

Next, gaps between the translucent body 10, the vibrator 20, the piezoelectric element 30, and the inner-layer optical component 50 in the optical module 1 will be described.

Returning to FIGS. 1 and 2, a first gap G1 is located between the translucent body 10 and the inner-layer optical component 50, a second gap G2 is located between the piezoelectric element 30 and the inner-layer optical component 50, and a third gap G3 is located between the vibrator 20 and the inner-layer optical component 50.

Figure 4A:
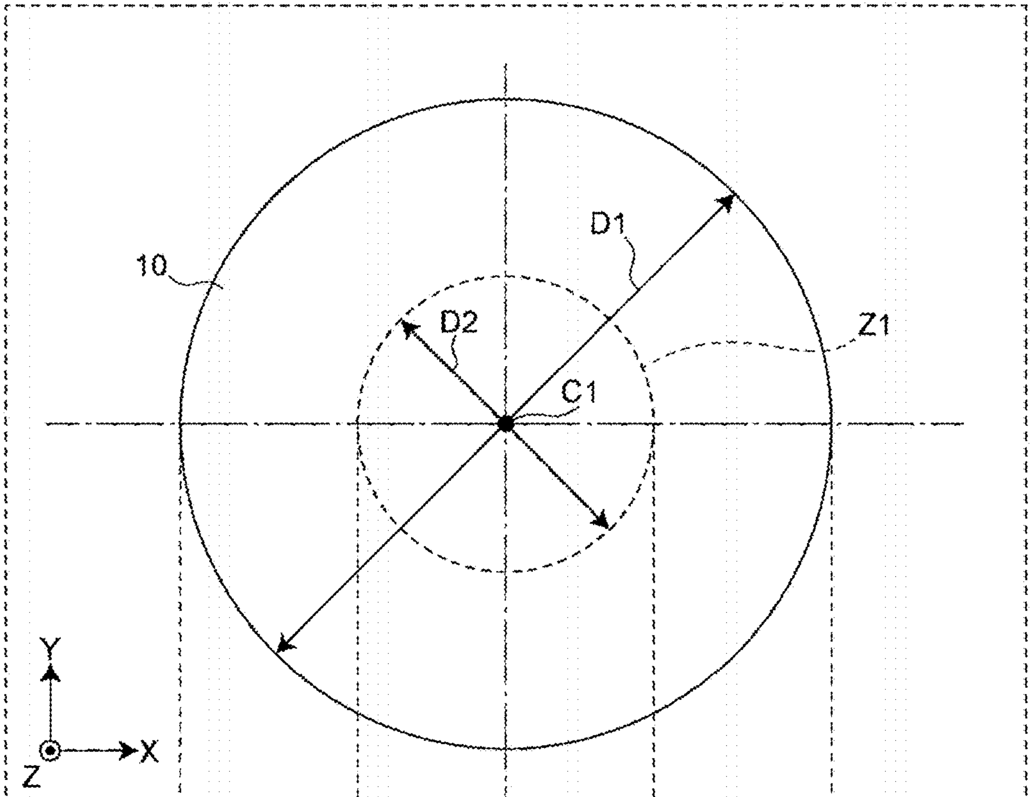
FIGS. 4A and 4B are schematic views for describing a first gap.
Figure 4B:
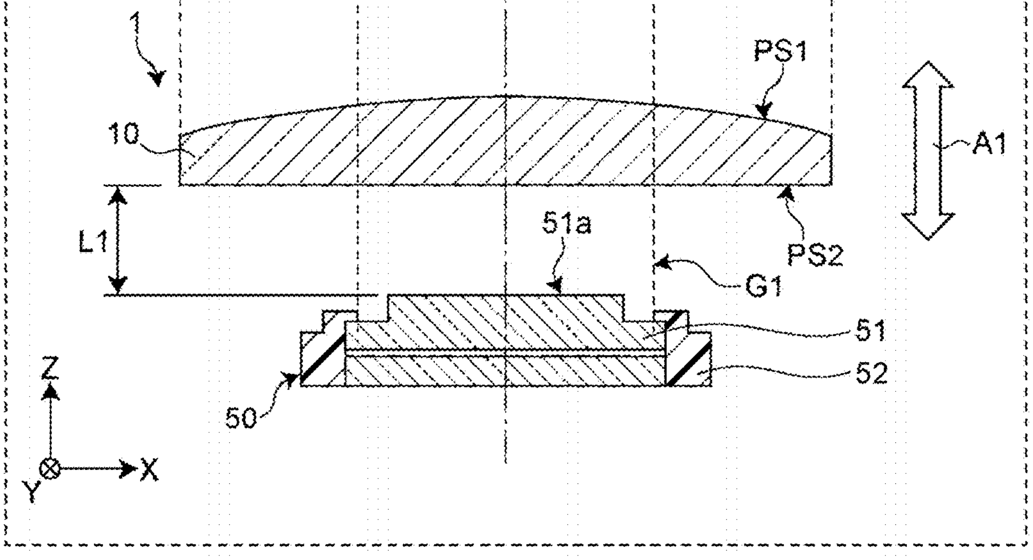

FIGS. 4A and 4B is a schematic view for describing the first gap G1. FIG. 4A is a schematic view of the translucent body 10 when viewed from the first main surface PS1 side. FIG. 4B is a schematic cross-sectional view of the vicinity of the translucent body 10. As shown in FIGS. 4A and 4B, the first gap G1 is located between the translucent body 10 and the inner-layer optical component 50. Specifically, the first gap G1 is formed between the second main surface PS2 of the translucent body 10 and a first surface 51*a* of the inner-layer lens 51. Here, the first surface 51*a* of the inner-layer lens 51 is a surface that defines the first gap G1 and faces the second main surface PS2 of the translucent body 10.

A first dimension L1 of the first gap G1 is determined in a range in which the vibration attenuation does not occur. The “range in which the vibration attenuation does not occur” will be described later. The first dimension L1 is a dimension of the translucent body 10 in a vibration direction A1. The “vibration direction A1” is vibration in a direction having a larger displacement component when a displacement distribution due to the vibration of the translucent body 10 is isolated in the X and Z-directions. In the present example embodiment, in the translucent body 10, the displacement component in the Z-direction is larger than the displacement component in the X-direction. Therefore, the vibration direction A1 is the Z-direction.

The first dimension L1 is defined by the shortest distance between the translucent body 10 and the inner-layer lens 51 in the vibration direction A1. That is, the first dimension L1 is defined by the shortest distance between the second main surface PS2 of the translucent body 10 and the first surface 51*a* of the inner-layer lens 51 in the Z-direction.

Preferably, the first dimension L1 is a distance between a central portion Z1 of the translucent body 10 and the inner-layer lens 51. The central portion Z1 means a central portion of the translucent body 10 when viewed from the first main surface PS1 side of the translucent body 10. For example, the central portion Z1 of the translucent body 10 is a circular region centered on a center C1 of the translucent body 10, when viewed from the first main surface PS1 side of the translucent body 10. For example, the central portion Z1 of the translucent body 10 has a diameter D2 that is about ⅔ times or less of an outer diameter D1 of the translucent body 10, when viewed from the first main surface PS1 side. Preferably, the diameter D2 may be about ½ times or less of the outer diameter D1 of the translucent body 10. The diameter D2 may be about ⅓ times or more of the outer diameter D1 of the translucent body 10. The first dimension L1 is determined as a dimension in which a distance between the second main surface PS2 of the translucent body 10 and the first surface 51*a* of the inner-layer lens 51 is the shortest in a range of the central portion Z1 of the translucent body 10.

More preferably, the first dimension L1 is determined as a dimension in which a distance between the second main surface PS2 at the center C1 of the translucent body 10 and the first surface 51*a* of the inner-layer lens 51 is the shortest.

Figure 5:
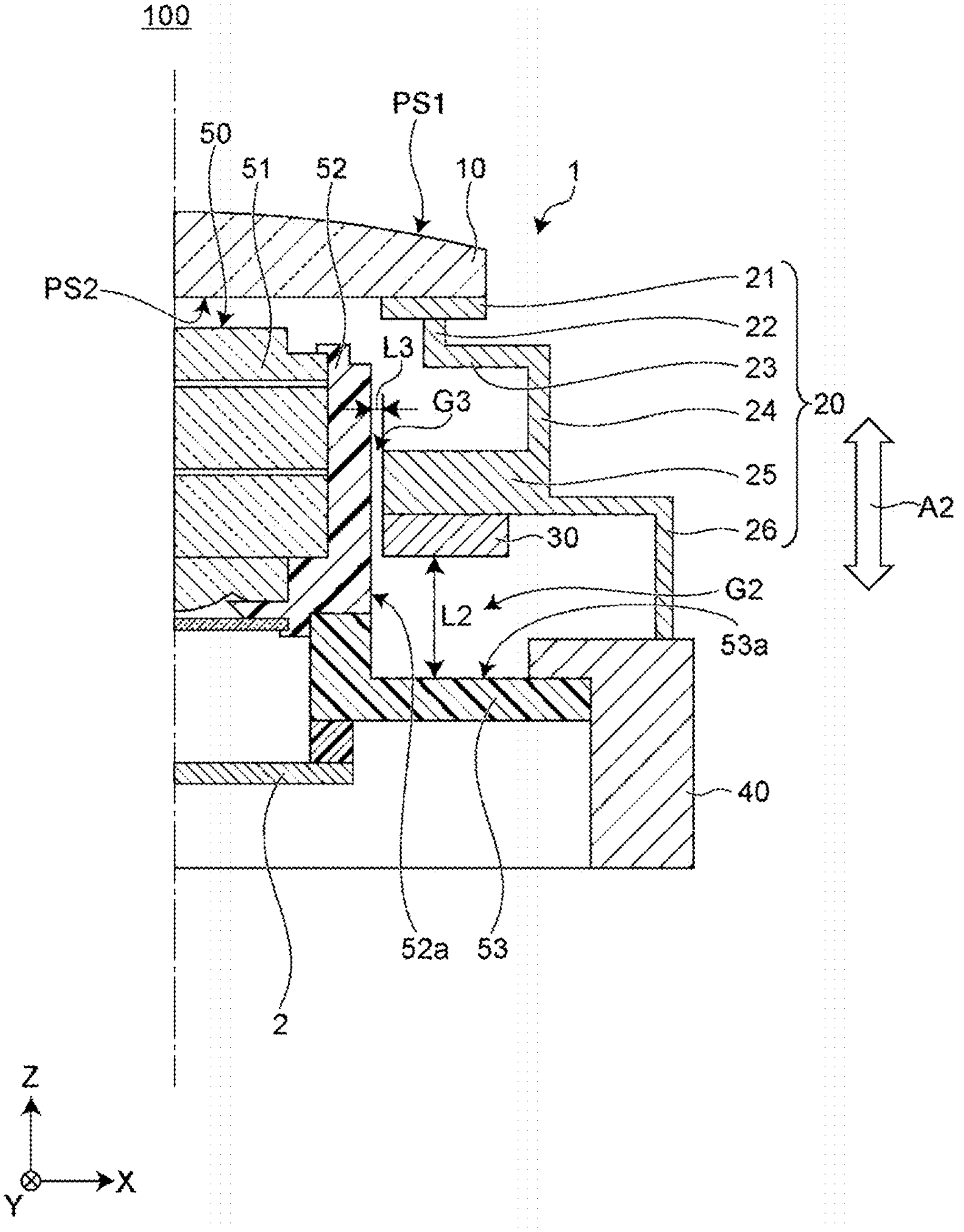
FIG. 5 is a schematic view for describing a second gap and a third gap.

FIG. 5 is a schematic view for describing the second gap G2 and the third gap G3. As shown in FIG. 5, the second gap G2 is formed between the piezoelectric element 30 and the inner-layer optical component 50. Specifically, the second gap G2 is located between the piezoelectric element 30 and the inner-layer flange 53. More specifically, the second gap G2 is located between a second surface 53*a* of the inner-layer flange 53 and a surface of the piezoelectric element 30 on an opposite side of a side on which the vibration plate 25 is provided. Here, the second surface 53*a* of the inner-layer flange 53 is a surface that defines the second gap G2 and faces the piezoelectric element 30.

A second dimension L2 of the second gap G2 is determined in a range in which the vibration attenuation does not occur, similarly to the first dimension L1 of the first gap G1. The second dimension L2 is a dimension of the piezoelectric element 30 in a vibration direction A2. In the present example embodiment, in the piezoelectric element 30, a displacement component in the Z-direction is larger than a displacement component in the X-direction. Therefore, the vibration direction A2 is the Z-direction.

The second dimension L2 is defined by the shortest distance between the piezoelectric element 30 and the inner-layer flange 53 in the vibration direction A2. That is, the second dimension L2 is defined by the shortest distance between the second surface 53*a* of the inner-layer flange 53 and the surface of the piezoelectric element 30 on the opposite side of the side on which the vibration plate 25 is provided, in the Z-direction.

As shown in FIG. 5, the third gap G3 is located between the vibrator 20 and the inner-layer optical component 50. A third dimension L3 of the third gap G3 is determined in a range in which the vibration attenuation does not occur. The third dimension L3 is defined by the shortest distance between the vibrator 20 and the lens holder 52. In the present example embodiment, the third dimension L3 is defined by the shortest distance between the vibrator 20 and an outer wall 52*a* of the lens holder 52 in the X and Y-directions.

Regarding Range in which Vibration Attenuation does not Occur

Figure 6:
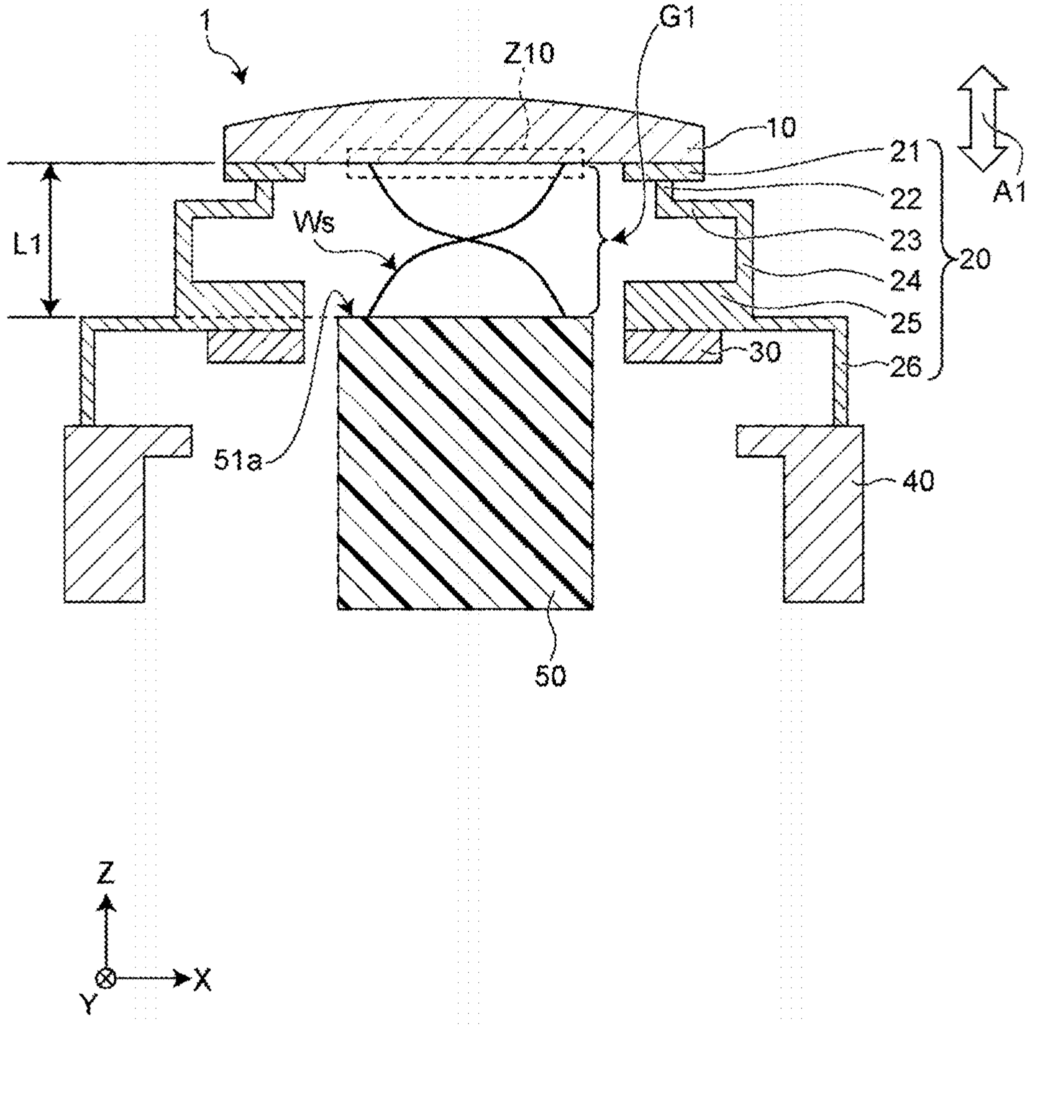
FIG. 6 is a schematic view for describing a relationship between a dimension of the first gap and an acoustic wave.

The range in which the vibration attenuation does not occur will be described with reference to FIG. 6. FIG. 6 is a schematic view for describing a relationship between the first dimension L1 of the first gap G1 and an acoustic wave.

As shown in FIG. 6, when the translucent body 10 vibrates in the vibration direction A1, an acoustic wave is generated from the translucent body 10 in the first gap G1. The acoustic wave generated from the translucent body 10 travels toward the first surface 51*a* of the inner-layer lens 51 and is reflected by the first surface 51*a* of the inner-layer optical component 50 (inner-layer lens 51). As a result, the acoustic wave that travels from the translucent body 10 toward the first surface 51*a* of the inner-layer optical component 50 and the acoustic wave reflected by the first surface 51*a* overlap each other, and thus a standing wave Ws including nodes and antinodes is generated.

In the standing wave Ws, in a region Z10 that is the antinode of the acoustic wave, the acoustic pressure is increased as compared with acoustic pressure in the other regions, and the air is compressed. Therefore, in the region Z10 that is the antinode of the acoustic wave, the compressed air acts as a damper, and the vibration attenuation (damping) is likely to occur. Thus, when the translucent body 10 is located in the region Z10 that is the antinode of the acoustic wave, the vibration of the translucent body 10 is attenuated.

Here, when the wavelength of the acoustic wave is denoted by "$\lambda$", the antinode of the acoustic wave is generated at a position corresponding to about $\lambda/2$. A calculation expression of the wavelength $\lambda$ is calculated by [wavelength (mm)]=[acoustic velocity (m/s)/frequency (Hz)].

In a case where the acoustic pressure of the region Z10 in which vibration is generated is increased due to the standing wave Ws, the air pressure is increased, and thus the springiness of the air is increased. The springiness of the air has a relationship of being proportional to the air pressure and being inversely proportional to the volume. This is clear from the expression [air spring constant K]=$10\times\gamma(P+0.1)A/V$] of the spring constant of the bellows-type air spring. P indicates the internal pressure, A indicates the effective air spring receiving area, and V indicates the air spring volume.

In a case where the attenuation in the vibration of the free vibration is considered, the critical attenuation rate is calculated by $Cc=2\sqrt{mk}$. m indicates the mass, and k indicates the spring constant. The larger the critical attenuation rate Cc is, the easier the vibration is attenuated. Therefore, it is considered that an increase in the spring constant of the air leads to vibration attenuation. From the above description, it can be said that the vibration attenuation occurs by the increase in the acoustic pressure in the region Z10 that is the antinode of the standing wave Ws.

Figure 7:
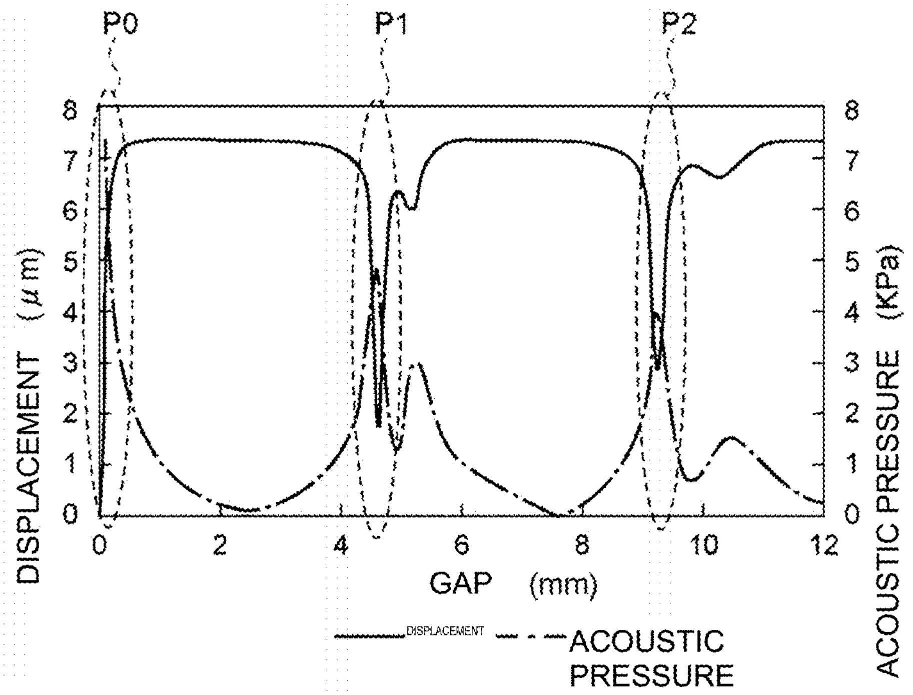
FIG. 7 is a graph showing an example of an analysis result of a relationship between displacement of a translucent body and acoustic pressure.
Figure 8:
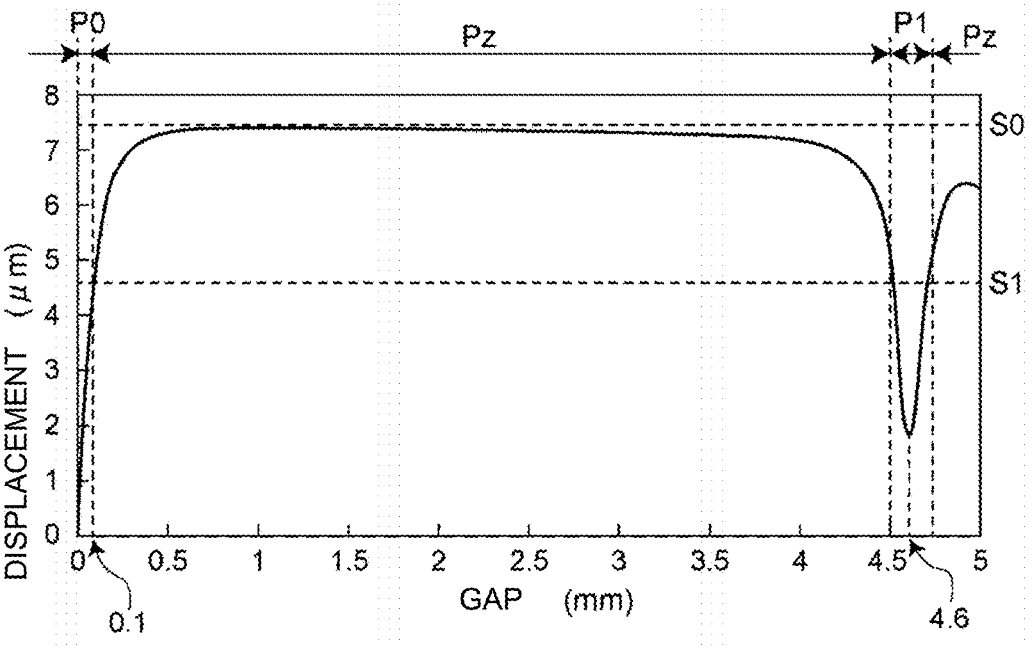
FIG. 8 is an enlarged graph of the graph in FIG. 7.

FIG. 7 is a graph showing an example of an analysis result of a relationship between the displacement of the translucent body 10 and the acoustic pressure. FIG. 8 is an enlarged graph of the graph in FIG. 7. The graphs shown in FIGS. 7 and 8 were acquired by performing piezoelectric/acoustic wave analysis (harmonic analysis, strong coupling) using Femtet manufactured by Murata Software Co., Ltd. In the analysis, a model in which a glass plate was disposed on the upper surface of the translucent body 10 in the Z-direction was used, and a distance between the glass plate and the upper surface of the translucent body was changed. An air layer was inserted into a gap between the glass plate and the upper surface of the translucent body 10. Regarding a material of the model, a material for forming the glass plate was borosilicate glass, a material for forming the vibrator 20 was stainless, and the piezoelectric element 30 was PZT. The translucent body 10 and the vibrator 20 were bonded to each other with epoxy resin. The resonant frequency of the vibrator 20 used for the analysis was about 27 kHz, and a wavelength $\lambda$ of the acoustic wave was set to about 9.2 mm from the acoustic velocity of the air, for example.

As shown in FIGS. 7 and 8, when the distance in the gap between the translucent body 10 and the glass plate in the Z-direction is changed, in regions P1 and P2 corresponding to the integer multiples of the half-wavelength $\lambda/2$ of the standing wave Ws, the acoustic pressure is increased and the vibration attenuation occurs, thereby reducing the displacement amount of the translucent body 10. Specifically, in a region in which the distance in the gap between the translucent body 10 and the glass plate in the Z-direction is in the vicinity of about 4.6 mm and about 9.6 mm, for example, the acoustic pressure is increased and the displacement amount of the translucent body 10 is reduced. The displacement amount of the translucent body 10 is also reduced in a region P0 in which the gap between the translucent body 10 and the glass plate is in the vicinity of 0 mm.

From the above description, it is considered that it is possible to reduce or prevent the vibration attenuation of the translucent body 10 by disposing the translucent body 10 to avoid the region P0 in which the gap is in the vicinity of 0 mm, and the regions P1 and P2 corresponding to the half-wavelength of the standing wave Ws.

As an example, a value in which a reduction amount from the maximum displacement amount S0 of the translucent body 10 is set to about 60%, for example, is a lower limit value S1 of the displacement amount of the translucent body 10. The lower limit value S1 may be set in a range in which liquid droplets adhering to the translucent body 10 can be removed. In FIG. 8, since the maximum displacement amount S0 is about 7.4 μm, the lower limit value S1 is about 4.7 μm, for example. In this case, in a region Pz of the translucent body 10 in which the vibration attenuation is reduced or prevented, the distance of the gap in the Z-direction is about 0.1 mm or more and about 4.5 mm or less, for example. In a case where the above distance is in this numerical range, it is possible to reduce or prevent the vibration attenuation of the translucent body 10.

Here, the vibration attenuation of the translucent body 10 occurs for each integer multiple of the half-wavelength λ/2 of the standing wave Ws. Therefore, the dimension of the gap for reducing or preventing the vibration attenuation of the translucent body 10 is in a range of about [(n×λ/2)+0.1 mm] or more and about [{(n+1)×λ/2}−0.1 mm] or less, for example. "n" is an integer of 0 or more, and "λ" is a wavelength of an acoustic wave generated by the vibration.

Thus, in the optical module 1, the first dimension L1 of the first gap G1 between the translucent body 10 and the inner-layer optical component 50 is in the range of about [(n×λ/2)+0.1 mm] or more and about [{(n+1)×λ/2}−0.1 mm] or less. In other words, in a case where a relationship of about [(n×λ/2)+0.1 mm]≤L1≤[{(n+1)×λ/2}−0.1 mm] is established in the first dimension L1, it is possible to reduce or prevent the vibration attenuation of the translucent body 10.

Preferably, the first dimension L1 is in a range of about 0.1 mm or more and about (λ/2−0.1 mm) or less, for example. That is, in the first dimension L1, a relationship of about 0.1 mm≤L1≤(λ/2−0.1 mm), for example, is preferably established. As a result, it is possible to further reduce or prevent the vibration attenuation of the translucent body 10.

The second dimension L2 of the second gap G2 between the piezoelectric element 30 and the inner-layer optical component 50 (inner-layer flange 53) is similar to the first dimension L1 of the first gap G1. That is, the second dimension L2 is in a range of about [(n×λ/2)+0.1 mm] or more and about [{(n+1)×λ/2}−0.1 mm] or less, for example. In other words, in a case where a relationship of about [(n×λ/2)+0.1 mm]≤L2≤[{(n+1)×λ/2}−0.1 mm], for example, is established in the second dimension L2, it is possible to reduce or prevent the vibration attenuation of the piezoelectric element 30.

Preferably, the second dimension L2 is in a range of about 0.1 mm or more (λ/2−0.1 mm), for example. That is, a relationship of about 0.1 mm≤L2≤(λ/2−0.1 mm), for example, is preferably established in the second dimension L2. As a result, it is possible to further reduce or prevent the vibration attenuation of the piezoelectric element 30.

In the present example embodiment, the example in which the first dimension L1 of the first gap G1 and the second dimension L2 of the second gap G2 are in the range of about [(n×λ/2)+0.1 mm] or more and about [{(n+1)×λ/2}−0.1 mm] or less, for example, has been described, but the present example embodiment is not limited thereto.

The third dimension L3 of the third gap G3 between the vibrator 20 and the side wall (outer wall) 52*a* of the inner-layer optical component 50 (lens holder 52) is preferably about 0.1 mm or more, for example.

Regarding Vibration Mode

Figure 9A:
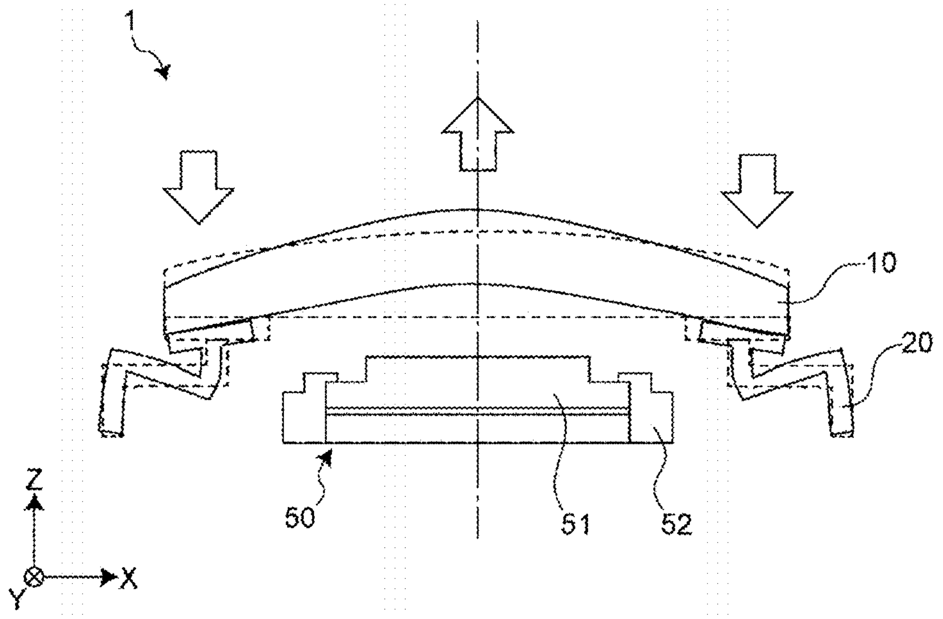
FIG. 9A is a schematic view for describing a first vibration mode.
Figure 9B:
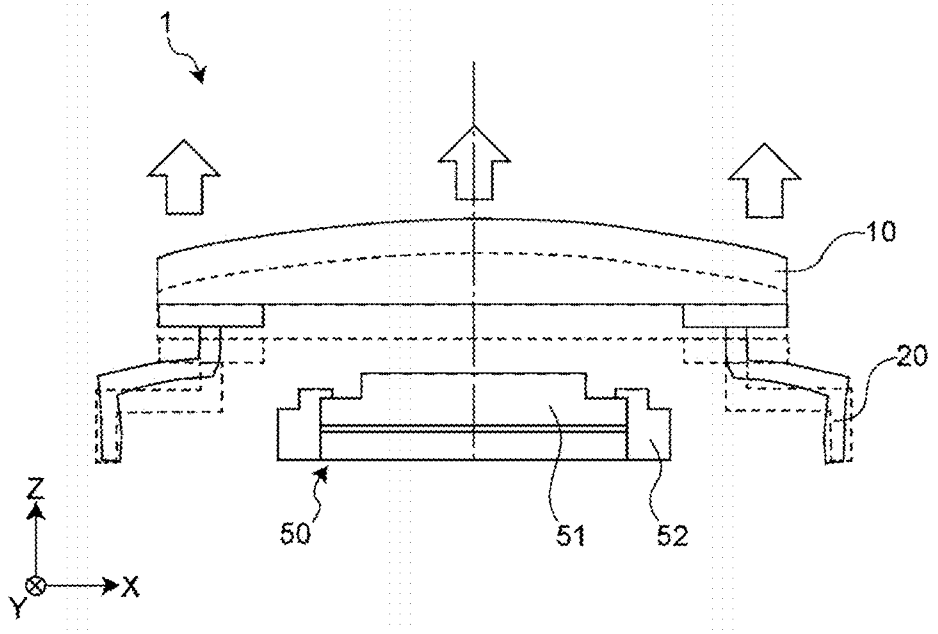
FIG. 9B is a schematic view for describing a second vibration mode.

The optical module 1 vibrates in a plurality of vibration modes. In the present example embodiment, the optical module 1 vibrates in a first vibration mode and a second vibration mode. FIGS. 9A and 9B are schematic views for describing the first vibration mode and the second vibration mode, respectively.

As shown in FIG. 9A, the first vibration mode is a bending vibration mode in which vibration is generated such that the displacement amount of the central portion of the translucent body 10 is larger than the displacement amount of the end portion. That is, in the first vibration mode, the central portion of the translucent body 10 vibrates larger than the end portion. In the first vibration mode, vibration in which a displacement direction of the central portion of the translucent body 10 is opposite to a displacement direction of the end portion is generated, and thus the translucent body 10 bends and vibrates. Therefore, liquid droplets adhering to the translucent body 10 are collected at the central portion of the translucent body 10.

As shown in FIG. 9B, the second vibration mode is a piston vibration mode in which the entire translucent body 10 vibrates uniformly and substantially uniformly. In the second vibration mode, the vibration is generated such that the entire translucent body 10 is displaced in the same direction, and thus the translucent body 10 vibrates like a piston. Therefore, the liquid droplet adhering to the translucent body 10 falls off from the translucent body 10.

The vibrator 20 and the piezoelectric element 30 are configured to vibrate in the first vibration mode and the second vibration mode. The first vibration mode and the second vibration mode are controlled by the control unit. For example, the control unit can switch between the first vibration mode and the second vibration mode by changing the frequency of the drive signal applied to the piezoelectric element 30. For example, in the optical module 1, the resonant frequency of the first vibration mode is about 37 kHz, and the resonant frequency of the second vibration mode is about 28 kHz. The resonant frequencies are merely examples, and may be changed depending on the dimensions and the material of each element of the optical module 1.

Figure 10:
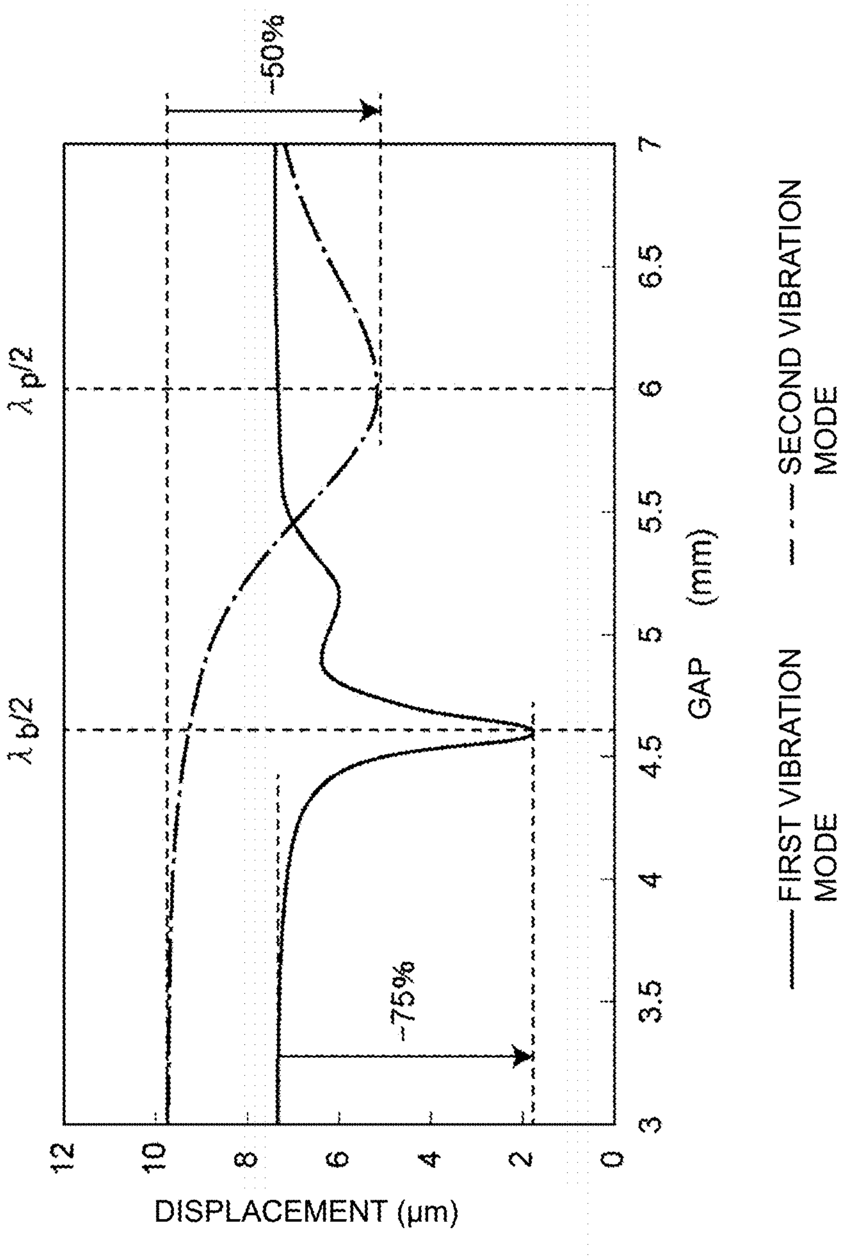
FIG. 10 is a graph showing an example of the relationship between the displacement of the translucent body and the acoustic pressure in a case where a dimension of a gap is used as a parameter in the first vibration mode and the second vibration mode.

FIG. 10 is a graph showing an example of the relationship between the displacement of the translucent body and the acoustic pressure in a case where the dimension of the gap is used as a parameter in the first vibration mode and the second vibration mode. As shown in FIG. 10, the half-wavelength $\lambda_b/2$ of the acoustic wave in the first vibration mode is about 4.6 mm, for example. The vibration attenuation occurs in the vicinity of about 4.6 mm in the gap dimension, and the displacement amount is reduced by about 75% from the maximum displacement amount, for example. The half-wavelength $\lambda_p$ of the acoustic wave in the second vibration mode is about 6 mm, for example. The vibration attenuation occurs in the vicinity of about 6 mm in the dimension of the gap, and the displacement amount is reduced by about 50% from the maximum displacement amount, for example.

As described above, it can be seen that the vibration attenuation occurs in both the first vibration mode and the second vibration mode when the dimension of the gap is in the vicinity of the half-wavelength of the acoustic wave. As a result, it is possible to reduce or prevent the vibration attenuation in both the first vibration mode and the second vibration mode by avoiding the region in which the dimension of the gap is the half-wavelength $\lambda_b/2$ and $\lambda_p/2$, for example. In particular, it can be said that there is a great advantage of applying the configuration of the present application because it is possible to improve the vibration attenuation by about 75% from the maximum displacement in the first vibration mode, for example.

Regarding Material for Forming Inner-Layer Optical Component

A material for forming the inner-layer optical component 50 will be described. In the present example embodiment, the inner-layer optical component 50 is made of a material having an acoustic impedance smaller than the acoustic impedance of the translucent body 10. As a result, it is possible to reduce or prevent an occurrence of a situation in which an acoustic wave generated in the first gap G1 between the translucent body 10 and the inner-layer optical component 50 is reflected by the first surface 51*a* of the inner-layer optical component 50. As a result, it is possible to reduce the acoustic pressure of the standing wave Ws.

The larger a difference between the acoustic impedance of a medium on an incidence side of the acoustic wave and the acoustic impedance of the medium on a reflection side of the acoustic wave, the larger the reflection of the acoustic wave. The acoustic impedance can be calculated from the acoustic velocity and the density of the medium.

In the present example embodiment, the medium on the incidence side of the acoustic wave is an air layer provided in the first gap G1. The medium on the side on which the acoustic wave is reflected is the inner-layer optical component 50 (inner-layer lens 51). As a result, it is possible to reduce or prevent the acoustic pressure of the standing wave Ws by reducing the difference of the acoustic impedance between the air layer of the first gap G1 and the inner-layer optical component 50.

Figures 11, 12:
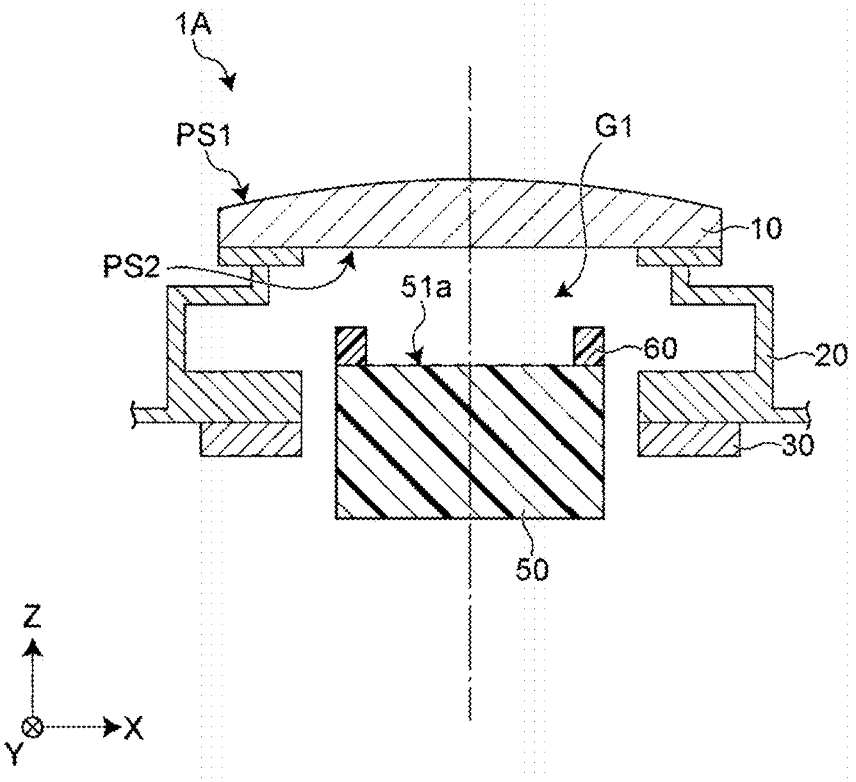
FIG. 11 is a table showing an example of a relationship between an acoustic impedance and a reflectivity in each material.
FIG. 12 is a schematic cross-sectional view showing a main configuration of an optical module in Modification Example 1.

FIG. 11 is a table showing an example of a relationship between the acoustic impedance and the reflectivity of the acoustic wave in each material. FIG. 11 shows the acoustic impedance in resin, glass, and air as an example. As shown in FIG. 11, the resin has an acoustic impedance smaller than the acoustic impedance of the glass. Therefore, the resin can reduce or prevent the reflection of the acoustic wave as compared with glass. Thus, in a case where the inner-layer optical component 50 is made of the resin, it is possible to reduce the reflection of the acoustic wave as compared with the glass.

Examples of the resin include amorphous polyolefin resin, polycarbonate resin, acrylic resin, polystyrene resin, and urethane resin.

In Example Embodiment 1, the example in which the inner-layer optical component 50 is made of resin has been described, but the present example embodiment is not limited thereto. The inner-layer optical component 50 need only be made of a material that has an acoustic impedance smaller than the acoustic impedance of the translucent body 10 and is capable of reducing or preventing the reflection of the acoustic wave. For example, the inner-layer lens 51 may be made of glass having an acoustic impedance smaller than the acoustic impedance of the translucent body 10.

Advantageous Effects

According to the optical module 1 and the optical device 100 according to Example Embodiment 1, it is possible to achieve the following advantageous effects.

The optical module 1 includes the translucent body 10, the vibrator 20, the piezoelectric element 30, and the inner-layer optical component 50. The vibrator 20 is tubular and supports the translucent body 10. The piezoelectric element 30 is disposed at the vibrator 20 and vibrates the vibrator 20. The inner-layer optical component 50 is disposed at the inner side portion of the vibrator 20. The first gap G1 is provided between the translucent body 10 and the inner-layer optical component 50, and the second gap G2 is provided between the piezoelectric element 30 and the inner-layer optical component 50. At least one of the first dimension L1 of the first gap G1 in the vibration direction (Z-direction) of the translucent body 10 and the second dimension L2 of the second gap G2 in the vibration direction (Z-direction) of the vibrator 20 is in the range of about [(n×λ/2)+0.1 mm] or more and about [{(n+1)×λ/2}−0.1 mm] or less, for example. Here, n indicates an integer of 0 or more, and λ indicates the wavelength of an acoustic wave generated by the vibration.

With such a configuration, it is possible to reduce or prevent the vibration attenuation. Specifically, in the first gap G1 and the second gap G2, when an acoustic wave generated by the vibration of the translucent body 10 and the piezoelectric element 30 is reflected by the inner-layer optical component 50, the standing wave Ws is generated. Therefore, in a range in which the first dimension L1 of the first gap G1 and/or the second dimension L2 of the second gap G2 is in the vicinity of the half-wavelength (n×λ/2) of the acoustic wave, the acoustic pressure is increased and the air is compressed, whereby the vibration attenuation occurs. Therefore, when the translucent body 10 and/or the piezoelectric element 30 is located in this range, the displacement amount is reduced by the vibration attenuation. In the optical module 1, since the first dimension L1 of the first gap G1 and/or the second dimension L2 of the second gap G2 is in the range of about [(n×λ/2)+0.1 mm] or more and about [{(n+1)×λ/2}−0.1 mm] or less, whereby the translucent body 10 and/or the piezoelectric element 30 avoids the range in which the vibration attenuation occurs. As a result, it is possible to efficiently vibrate the translucent body 10 and efficiently remove the liquid droplets adhering to the translucent body 10.

At least one of the first dimension L1 or the second dimension L2 is in the range of about 0.1 mm or more and about (λ/2−0.1 mm) or less, for example. With such a configuration, it is possible to achieve reduction in size of the optical module 1 while reducing or preventing the vibration attenuation.

The third gap G3 is provided between the vibrator 20 and the side wall (outer wall) 52*a* of the inner-layer optical component 50, and the third dimension L3 of the third gap G3 is about 0.1 mm or more, for example. With such a configuration, it is possible to further reduce or prevent the vibration attenuation.

The first dimension L1 of the first gap G1 is the distance between the central portion Z1 of the translucent body 10 and the inner-layer optical component 50. With such a configuration, it is possible to reduce or prevent the vibration attenuation in the central portion Z1 of the translucent body 10.

The vibrator 20 and the piezoelectric element 30 are configured such that the entire translucent body 10 vibrates uniformly or substantially uniformly. With such a configuration, it is possible to reduce or prevent the vibration attenuation of the translucent body 10 even in a case where the entire translucent body 10 vibrates uniformly or substantially uniformly.

The vibrator 20 and the piezoelectric element 30 are configured such that the central portion of the translucent body 10 vibrates more largely than the end portion. With such a configuration, it is possible to reduce or prevent the vibration attenuation of the translucent body 10 even in a case where the central portion of the translucent body 10 vibrates more largely than the end portion.

The inner-layer optical component 50 is made of the material having an acoustic impedance smaller than the acoustic impedance of the translucent body 10. Preferably, the inner-layer optical component 50 is made of resin. With such a configuration, it is possible to reduce or prevent the reflection of an acoustic wave in the inner-layer optical component 50 and further reduce or prevent the vibration attenuation.

The inner-layer optical component 50 includes the inner-layer lens 51, the lens holder 52, and the inner-layer flange 53. The lens holder 52 holds the inner-layer lens 51. The inner-layer flange 53 extends toward the outer side portion from the outer wall 52*a* of the lens holder 52. The first gap G1 is provided between the translucent body 10 and the inner-layer lens 51, and the second gap G2 is provided between the piezoelectric element 30 and the inner-layer flange 53. With such a configuration, it is possible to reduce or prevent the vibration attenuation of the translucent body 10 and/or the piezoelectric element 30.

The optical device 100 includes the optical module 1 and the optical element 2 disposed at the optical module 1. With such a configuration, it is possible to exhibit the similar effects to the effects of the optical module 1 described above.

Modification Example 1

FIG. 12 is a schematic cross-sectional view showing a main configuration of an optical module 1A in Modification Example 1. As shown in FIG. 12, the optical module 1A includes an acoustic wave suppressor 60 disposed at the inner-layer optical component 50. The acoustic wave suppressor 60 is disposed on the first surface 51*a* of the inner-layer optical component 50. The first surface 51*a* is a surface that defines the first gap G1 between the translucent body 10 and the inner-layer optical component 50 (inner-layer lens 51).

The acoustic wave suppressor 60 suppresses the reflection of an acoustic wave. The acoustic wave suppressor 60 is, for example, a structure made of a foamed resin material or a porous material. As the foamed resin material, for example, polyurethane, polystyrene, polyolefin, polyethylene, polypropylene, phenol resin, polyvinyl chloride, urea resin, silicone, polyimide, melamine resin, or the like can be used. As the porous material, for example, glass wool or the like can be used.

The acoustic wave suppressor 60 preferably has a ring shape when viewed in the Z-direction of the optical module 1A. Specifically, the acoustic wave suppressor 60 is disposed along the outer periphery of the first surface 51*a* of the inner-layer optical component 50.

As described above, by disposing the acoustic wave suppressor 60 at the inner-layer optical component 50, it is possible to reduce or prevent the reflection of the acoustic wave in the inner-layer optical component 50. As a result, it is possible to reduce the acoustic pressure, and further reduce or prevent the vibration attenuation.

In Modification Example 1, the aspect in which the acoustic wave suppressor 60 is disposed on the first surface 51*a* of the inner-layer optical component 50 has been described, but the present disclosure is not limited thereto. For example, the acoustic wave suppressor 60 may be disposed on the second surface 53*a* of the inner-layer optical component 50 (inner-layer flange 53) that defines the second gap G2 between the piezoelectric element 30 and the inner-layer optical component 50.

The inner-layer optical component 50 may include the first surface 51*a* that defines the first gap G1 and the second surface 53*a* that defines the second gap G2, and the acoustic wave suppressor 60 that suppresses the reflection of the acoustic wave may be disposed on at least one of the first surface 51*a* or the second surface 53*a*.

Alternatively, the acoustic wave suppressor 60 may be disposed on a surface that defines a gap other than the first surface 51*a* and the second surface 53*a*. The acoustic wave suppressor 60 may be disposed at a position that does not obstruct the optical path of the optical element 2.

Modification Example 2

Figure 13:
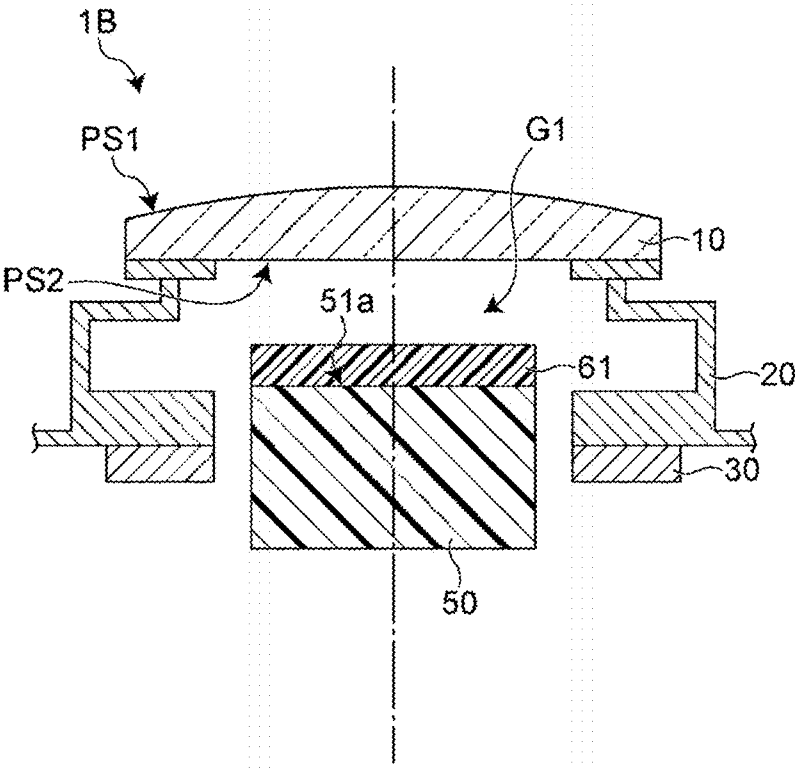
FIG. 13 is a schematic cross-sectional view showing a main configuration of an optical module in Modification Example 2.

FIG. 13 is a schematic cross-sectional view showing a main configuration of an optical module 1B in Modification Example 2. As shown in FIG. 13, in the optical module 1B, resin coating having translucency is performed on the first surface 51*a* of the inner-layer optical component 50 (inner-layer lens 51).

As the resin coating, for example, a material such as a fluorine-based coating material or a silicone-based coating material can be used. Examples of the fluorine-based coating material include fluorine-based polymers and polytetrafluoroethylene (PTFE). Examples of the silicone-based coating material include a material in which a main chain portion such as a silicone oil has a portion formed by a direct bond between silicon (Si) and oxygen (O).

As described above, by performing the resin coating on the first surface 51*a* of the inner-layer optical component 50 (inner-layer lens 51), it is possible to reduce or prevent the reflection of the acoustic wave on the first surface 51*a*.

In Modification Example 2, the aspect in which the resin coating is performed on the first surface 51*a* of the inner-layer optical component 50 has been described, but the present disclosure is not limited thereto. For example, the resin coating may be performed on the second surface 53*a* of the inner-layer optical component 50 (inner-layer flange 53).

The inner-layer optical component 50 includes the first surface 51*a* that defines the first gap G1 and the second surface 53*a* that defines the second gap G2, and the resin coating 61 may be performed on at least one of the first surface 51*a* and the second surface 53*a*.

Alternatively, the resin coating 61 may be performed on a surface that defines a gap other than the first surface 51*a* and the second surface 53*a*.

Modification Example 3

Figure 14:
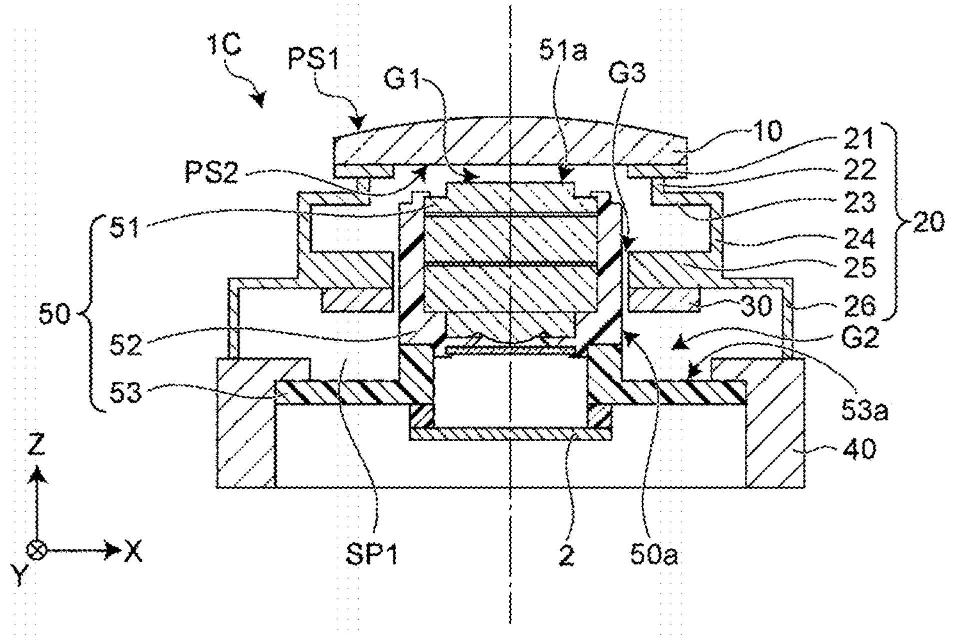
FIG. 14 is a schematic cross-sectional view showing a main configuration of an optical module in Modification Example 3.

FIG. 14 is a schematic cross-sectional view showing a main configuration of an optical module 1C in Modification Example 3. As shown in FIG. 14, in the optical module 1C, a space SP1 at the inner side portion of the vibrator 20 is at negative pressure. The negative pressure means a state in which the air pressure is lower than the atmospheric pressure. Preferably, the air pressure in the space SP1 is about ½ times or less the atmospheric pressure, for example. More preferably, the space SP1 is in a vacuum.

The inner space SP1 of the vibrator 20 is a space between the vibrator 20 and the inner-layer optical component 50. In the optical module 1C, the vibrator 20 and the inner-layer optical component 50 are bonded to the fixing portion 40. For example, the vibrator 20 and the fixing portion 40 are integrally formed, and the inner-layer optical component 50 is welded to the fixing portion 40 by laser welding or the like. As a result, the sealed space SP1 is provided between the vibrator 20 and the inner-layer optical component 50. In manufacturing the optical module 1C, the space SP1 can be put into negative pressure or vacuum by performing the manufacturing under a negative pressure or vacuum environment.

Figure 15:
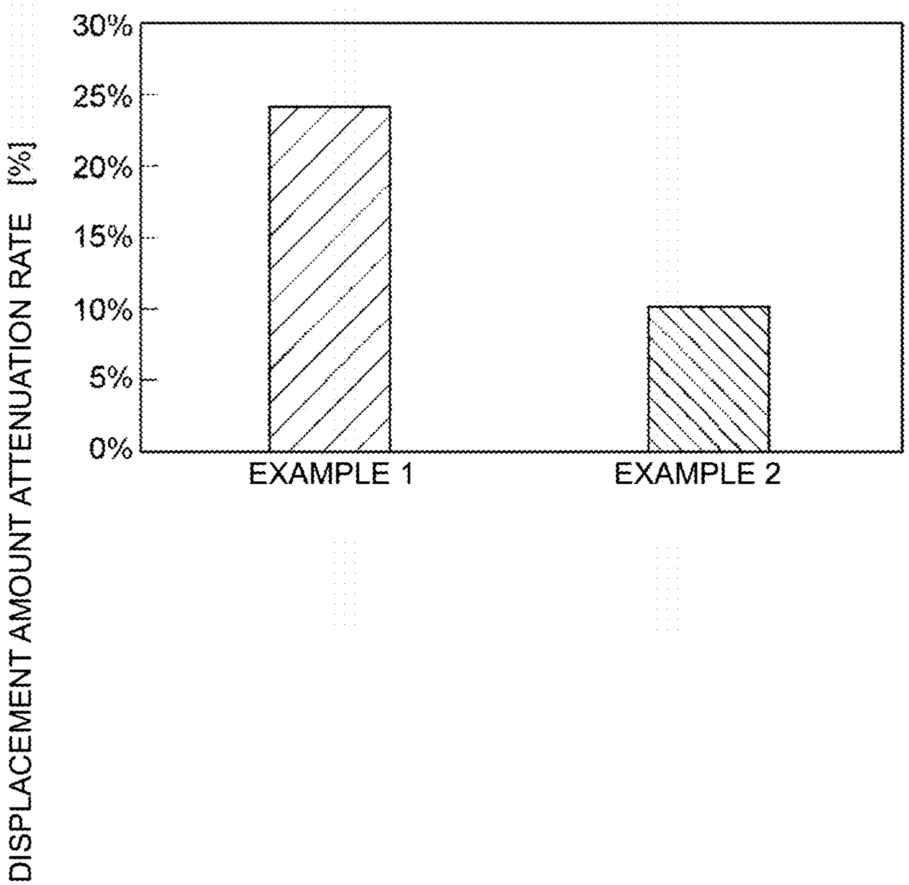
FIG. 15 is a graph showing a displacement amount attenuation rate in a case where an inner space of a vibrator is put into negative pressure.

FIG. 15 is a graph showing a displacement amount attenuation rate in a case where the inner space SP1 of the vibrator 20 is put into negative pressure. In FIG. 15, Example 1 shows the displacement amount attenuation rate in a state in which the space SP1 is at the atmospheric pressure, and Example 2 shows the displacement amount attenuation rate in a state in which the space SP1 is in the negative pressure of about ⅒ times the atmospheric pressure, for example.

As shown in FIG. 15, the displacement amount attenuation rate in Example 2 is smaller than in Example 1. As described above, by putting the inner space SP1 of the vibrator 20 into the negative pressure, it is possible to reduce or prevent the reflection of the acoustic wave and reduce or prevent the vibration attenuation of the translucent body 10 or the piezoelectric element 30.

In Modification Example 3, the example in which the inner space SP1 of the vibrator 20 is put into the vacuum or the negative pressure has been described, but the present disclosure is not limited thereto. For example, the inner space SP1 of the vibrator 20 may include or be filled with a gas having density lower than air. Examples of the gas include nitrogen, neon, helium, and ethylene. Even with such a configuration, it is possible to reduce or prevent the reflection of the acoustic waves and reduce or prevent the vibration attenuation of the translucent body 10 or the piezoelectric element 30.

Example Embodiment 2

A vibration device according to Example Embodiment 2 of the present invention will be described. In Example Embodiment 2, differences from Example Embodiment 1 will be mainly described. In Example Embodiment 2, the same or equivalent configurations as those in Example Embodiment 1 will be denoted by the same reference signs. In Example Embodiment 2, the description overlapping with Example Embodiment 1 will be omitted.

Figure 16:
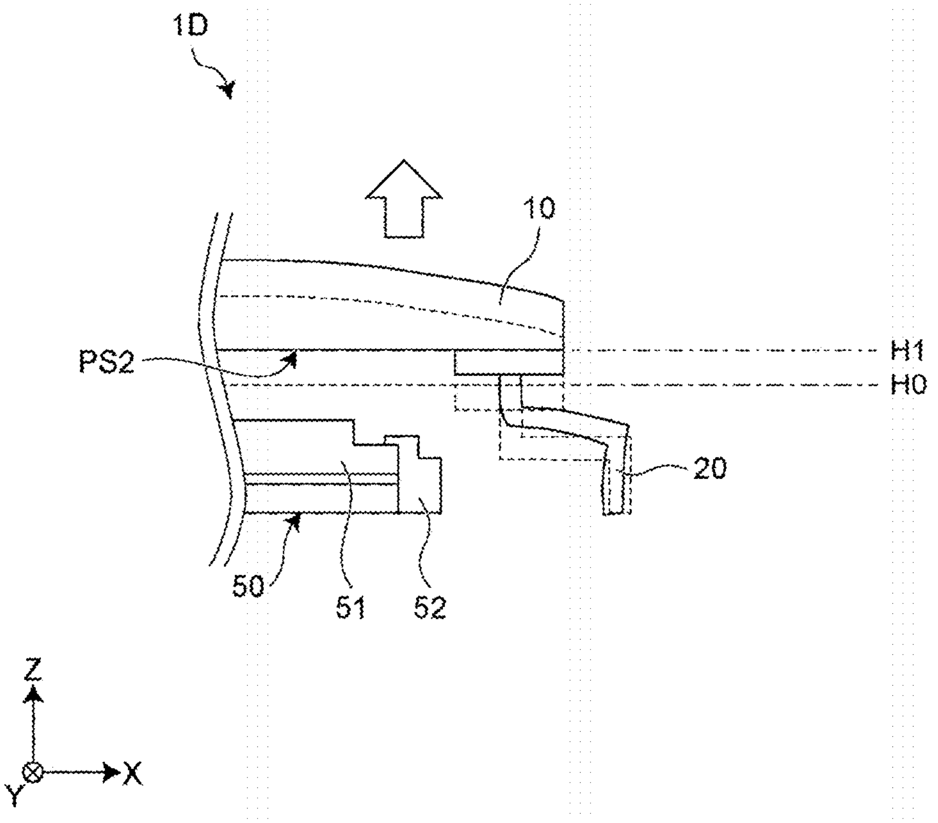
FIG. 16 is a schematic cross-sectional view showing an example of an optical device in Example Embodiment 2 according to the present invention.
Figures 17A, 17B:
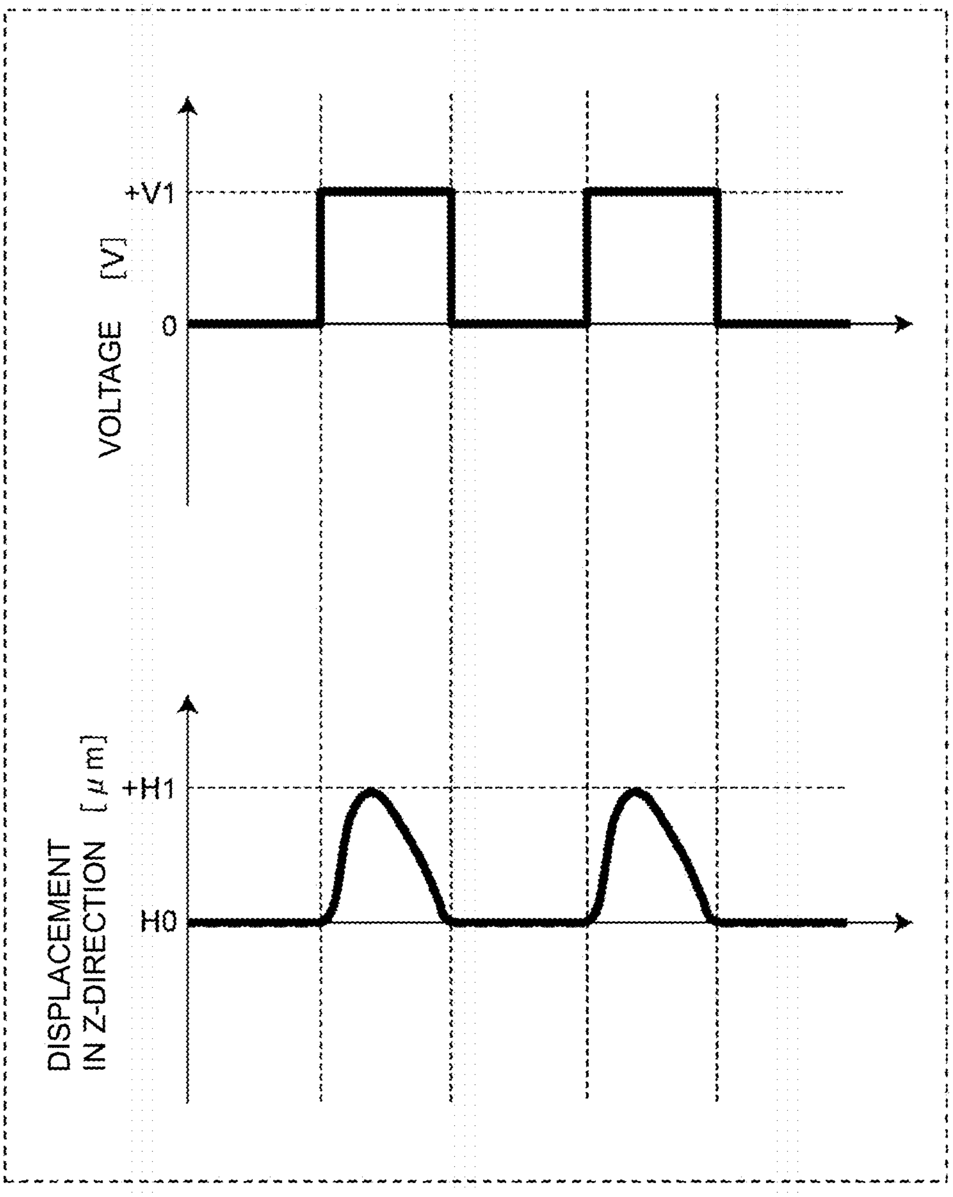
FIGS. 17A and 17B are schematic views showing a relationship between an applied voltage of a piezoelectric element and the displacement of a translucent body.

FIG. 16 is a schematic cross-sectional view showing an example of an optical module 1D in Example Embodiment 2 according to the present invention. FIGS. 17A and 17B are schematic views showing a relationship between an applied voltage of a piezoelectric element 30 and displacement of a translucent body 10. FIG. 17A shows the applied voltage of the piezoelectric element 30. FIG. 17B shows the displacement of the translucent body 10 in the Z-direction.

Example Embodiment 2 is different from Example Embodiment 1 in that, in a case where a position of the translucent body 10 in a state in which the translucent body 10 does not vibrate is a reference position H0, a direction in which the translucent body is spaced away from an inner-layer optical component 50 with respect to the reference position H0 in a thickness direction (Z-direction) of the translucent body is a positive direction, and a direction in which the translucent body approaches the inner-layer optical component 50 with respect to the reference position H0 is a negative direction, in the translucent body 10, displacement in the positive direction is larger than displacement in the negative direction.

In Example Embodiment 2, the optical module 1D has the similar configuration to the optical module 1 in Example Embodiment 1, unless particularly described.

In FIG. 16, the position of the translucent body 10 in a state in which the translucent body 10 does not vibrate is set as the reference position H0. In Example Embodiment 2, the reference position H0 means a position of a second main surface PS2 of the translucent body 10 in the thickness direction (Z-direction) of the translucent body 10 in a state in which the translucent body 10 does not vibrate. In addition, in the thickness direction (Z-direction) of the translucent body 10, a direction spaced away from the inner-layer optical component 50 with respect to the reference position H0 is set as the positive direction, and a direction approaching to the inner-layer optical component 50 with respect to the reference position H0 is set as the negative direction.

In the optical module 1D, the translucent body 10 vibrates such that the displacement in the positive direction is larger than the displacement in the negative direction. That is, in the translucent body 10, the displacement in the positive direction is larger than the displacement in the negative direction. For example, the displacement in the negative direction is about ⅓ times or less the displacement in the positive direction, for example. Preferably, the displacement in the negative direction is about ⅒ times or less the displacement in the positive direction, for example. More preferably, the displacement in the negative direction is 0.

In addition, in the vibration of the translucent body 10, the displacement in the positive direction is larger than the displacement in the negative direction. For example, in the vibration of the translucent body 10, a ratio between the displacement in the positive direction and the displacement in the negative direction is about 6:4 or more and about 10:0 or less, for example. Preferably, the ratio between the displacement in the positive direction and the displacement in the negative direction is about 8:2 or more and about 10:0 or less, for example. More preferably, the vibration of the translucent body 10 includes only the displacement in the positive direction.

As shown in FIGS. 17A and 17B, a control unit 3 realizes the vibration of the translucent body 10 in which the displacement in the positive direction is larger than the displacement in the negative direction, by controlling the voltage applied to the piezoelectric element 30. For example, the control unit 3 repeats application of a positive-direction voltage +V1 and stopping of the voltage application with respect to the piezoelectric element 30.

Specifically, the control unit 3 applies the positive-direction voltage +V1 to the piezoelectric element 30 for a predetermined time, and then stops the application of the voltage, and sets the applied voltage to 0. After a predetermined time has elapsed in a state in which the applied voltage is 0, the control unit 3 applies the positive-direction voltage +V1 again for a predetermined time. For example, the voltage application and the stopping may be performed at equal intervals or may be performed randomly. As described above, the control unit 3 repeats the application of the positive-direction voltage +V1 and the stopping of the voltage application. That is, the control unit 3 applies the positive-direction voltage +V1 to the piezoelectric element 30 without applying a negative-direction voltage.

As shown in FIGS. 17A and 17B, the displacement of the translucent body 10 in the thickness direction (Z-direction) is controlled by the voltage applied to the piezoelectric element 30. The translucent body 10 does not vibrate when the voltage application to the piezoelectric element 30 is stopped. When the positive-direction voltage +V1 is applied to the piezoelectric element 30, the translucent body 10 vibrates in a direction extending away from the inner-layer optical component 50 with respect to the reference position H0 in the thickness direction (Z-direction) of the translucent body 10, that is, the translucent body 10 performs displacement in the positive direction. That is, in a case where the positive-direction voltage +V1 is applied to the piezoelectric element 30, the translucent body 10 vibrates with the displacement +H1 in the positive direction.

As described above, by repeating the application of the positive-direction voltage +V1 and the stopping of the voltage application with respect to the piezoelectric element 30, the translucent body 10 vibrates between the reference position H0 and the displacement +H1 in the positive direction.

Advantageous Effects

According to the optical module 1D according to Example Embodiment 2, it is possible to exhibit the following effects.

In a case where the position of the translucent body 10 in a state in which the translucent body 10 does not vibrate is set as the reference position H0, the direction in which the translucent body is spaced away from the inner-layer optical component 50 with respect to the reference position H0 in the thickness direction (Z-direction) of the translucent body 10 is set as the positive direction, and the direction in which the translucent body approaches the inner-layer optical component 50 with respect to the reference position H0 is set as the negative direction, in the translucent body 10, the displacement in the positive direction is larger than the displacement in the negative direction.

With such a configuration, it is possible to reduce or prevent the displacement in the negative direction when the translucent body 10 vibrates. As a result, it is possible to reduce or prevent the compression of the air between the translucent body 10 and the inner-layer optical component 50. As a result, it is possible to reduce or prevent the vibration attenuation due to the increase in the air spring constant.

The optical module 1D further includes the control unit 3 that controls the piezoelectric element 30, and the control unit 3 repeats the application of the positive-direction voltage and the stopping of the voltage application with respect to the piezoelectric element 30.

With such a configuration, it is possible to easily make the displacement in the positive direction larger than the displacement in the negative direction.

In Example Embodiment 2, the example in which the reference position H0 is the position of the second main surface PS2 of the translucent body 10 in a state in which the translucent body 10 does not vibrate has been described, but the present disclosure is not limited thereto. For example, the reference position H0 may be the position of the first main surface PS1 of the translucent body 10 in a state in which the translucent body 10 does not vibrate.

In Example Embodiment 2, the example in which the control unit 3 repeats the application of the positive-direction voltage and the stopping of the voltage application with respect to the piezoelectric element 30 has been described, but the present disclosure is not limited thereto. For example, the control unit 3 may apply a negative-direction voltage. In this case, the negative-direction voltage may be smaller than the positive-direction voltage. Alternatively, the application of the negative-direction voltage may be smaller than the application of the positive-direction voltage.

Example embodiments of the present invention have been described in sufficient detail with reference to the accompanying drawings, but various modifications and changes can be made. It should be understood that such a modification or change is included in example embodiments of the present invention as long as it does not depart from the scope of the present invention according to the accompanying claims.

The vibration devices and vibration control methods according to the example embodiments of the present invention can be applied to an in-vehicle camera, a surveillance camera, an optical sensor such as LiDAR, or the like used outdoors.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An optical module comprising:

a translucent body;

a vibrator that is tubular and supports the translucent body;

a piezoelectric element located at the vibrator to vibrate the vibrator; and an inner-layer optical component located at an inner side portion of the vibrator;

wherein a first gap is located between the translucent body and the inner-layer optical component;

a second gap is located between the piezoelectric element and the inner-layer optical component;

at least one of a first dimension of the first gap in a vibration direction of the translucent body and a second dimension of the second gap in the vibration direction is in a range of about $[(n\times\lambda/2)+0.1\text{ mm}]$ or more and about $[\{(n+1)\times\lambda/2\}-0.1\text{ mm}]$ or less; and n indicates an integer of 0 or more, and λ indicates a wavelength of an acoustic wave generated by vibration.

2. The optical module according to claim 1, wherein at least one of the first dimension or the second dimension is in a range of about 0.1 mm or more and about $(\lambda/2-0.1\text{ mm})$ or less.

3. The optical module according to claim 1, wherein a third gap is located between the vibrator and a side wall of the inner-layer optical component; and a third dimension of the third gap is about 0.1 mm or more.

4. The optical module according to claim 1, wherein the first dimension of the first gap is a distance between a central portion of the translucent body and the inner-layer optical component.

5. The optical module according to claim 1, wherein the vibrator and the piezoelectric element are configured such that an entirety of the translucent body vibrates uniformly or substantially uniformly.

6. The optical module according to claim 1, wherein the vibrator and the piezoelectric element are configured such that a central portion of the translucent body vibrates more largely than an end portion.

7. The optical module according to claim 1, wherein the inner-layer optical component is made of a material with an acoustic impedance smaller than an acoustic impedance of the translucent body.

8. The optical module according to claim 7, wherein the inner-layer optical component is made of a resin.

9. The optical module according to claim 1, wherein the inner-layer optical component includes:

an inner-layer lens;

a lens holder that holds the inner-layer lens; and an inner-layer flange that extends from an outer wall of the lens holder toward an outer side portion;

the first gap is located between the translucent body and the inner-layer lens; and the second gap is located between the piezoelectric element and the inner-layer flange.

10. The optical module according to claim 1, wherein the inner-layer optical component includes a first surface that defines the first gap and a second surface that defines the second gap; and an acoustic wave suppressor to reduce or prevent reflection of an acoustic wave is located at at least one of the first surface and the second surface.

11. The optical module according to claim 1, wherein the inner-layer optical component includes a first surface that defines the first gap and a second surface that defines the second gap; and at least one of the first surface and the second surface is subjected to resin coating.

12. The optical module according to claim 1, wherein an inner space of the vibrator is in a vacuum or at negative pressure.

13. The optical module according to claim 1, wherein an inner space of the vibrator includes a gas having density lower than density of air.

14. The optical module according to claim 1, wherein in a case where a position of the translucent body in a state in which the translucent body does not vibrate is a reference position, a direction in which the translucent body is spaced away from the inner-layer optical component with respect to the reference position in a thickness direction of the translucent body is a positive direction, and a direction in which the translucent body approaches the inner-layer optical component with respect to the reference position is a negative direction, in the translucent body, displacement in the positive direction is larger than displacement in the negative direction.

15. The optical module according to claim 14, further comprising a controller configured or programmed to control the piezoelectric element and repeat application of a positive-direction voltage and stopping of voltage application with respect to the piezoelectric element.

16. An optical device comprising:

the optical module according to claim 1; and an optical element at the optical module.

17. The optical device according to claim 16, wherein at least one of the first dimension or the second dimension is in a range of about 0.1 mm or more and about ($\lambda$/2−0.1 mm) or less.

18. The optical device according to claim 16, wherein a third gap is located between the vibrator and a side wall of the inner-layer optical component; and a third dimension of the third gap is about 0.1 mm or more.

19. The optical device according to claim 16, wherein the first dimension of the first gap is a distance between a central portion of the translucent body and the inner-layer optical component.

20. The optical device according to claim 16, wherein the vibrator and the piezoelectric element are configured such that an entirety of the translucent body vibrates uniformly or substantially uniformly.

* * * * *